US010083835B2

(12) United States Patent
Laven et al.

(10) Patent No.: US 10,083,835 B2
(45) Date of Patent: Sep. 25, 2018

(54) FORMING ELECTRODE TRENCHES BY USING A DIRECTED ION BEAM AND SEMICONDUCTOR DEVICE WITH TRENCH ELECTRODE STRUCTURES

(71) Applicant: Infineon Technologies AG, Neubiberg (DE)

(72) Inventors: Johannes Georg Laven, Taufkirchen (DE); Anton Mauder, Kolbermoor (DE); Roland Rupp, Lauf (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/634,406

(22) Filed: Jun. 27, 2017

(65) Prior Publication Data

US 2018/0005830 A1 Jan. 4, 2018

(30) Foreign Application Priority Data

Jun. 30, 2016 (DE) .................. 10 2016 111 998

(51) Int. Cl.
*H01L 21/263* (2006.01)
*H01L 21/265* (2006.01)
(Continued)

(52) U.S. Cl.
CPC ........ *H01L 21/2633* (2013.01); *H01L 21/047* (2013.01); *H01L 21/049* (2013.01);
(Continued)

(58) Field of Classification Search
None
See application file for complete search history.

(56) References Cited

U.S. PATENT DOCUMENTS 7,977,252 B2   7/2011 Smirnov et al.
8,349,714 B2   1/2013 Tanaka et al.
(Continued)

FOREIGN PATENT DOCUMENTS

JP    H03-036725     2/1991
JP    2004-273849    9/2004
(Continued)

OTHER PUBLICATIONS

Simon Ruffel, et al., "Directed Ribbon-Beam Capability for Novel Etching Applications", J. Vac. Sci. Techno. B 33(6) Nov./Dec. 2015; American Vacuum Society.
(Continued)

*Primary Examiner* — Joseph Schoenholtz
(74) *Attorney, Agent, or Firm* — Dicke, Billig & Czaja, PLLC

(57) ABSTRACT

By directing an ion beam with a beam divergence $\theta$ on a process surface of a semiconductor substrate, parallel electrode trenches are formed in the semiconductor substrate. A center axis of the directed ion beam is tilted to a normal to the process surface at a tilt angle $\alpha$, wherein at least one of the tilt angle $\alpha$ and the beam divergence $\theta$ is not equal to zero. The semiconductor substrate is moved along a direction parallel to the process surface during formation of the electrode trenches. A conductive electrode is formed in the electrode trenches, wherein first sidewalls of the electrode trenches are tilted to the normal by a first slope angle $\varphi 1$ with $\varphi 1 = (\alpha + \theta/2)$ and second sidewalls are tilted to the normal by a second slope angle $\varphi 2$ with $\varphi 2 = (\alpha - \theta/2)$.

23 Claims, 14 Drawing Sheets

(51) Int. Cl.
*H01L 21/04* (2006.01)
*H01L 21/3065* (2006.01)
*H01L 21/266* (2006.01)
*H01L 29/739* (2006.01)
*H01L 21/67* (2006.01)
*H01L 21/28* (2006.01)
*H01L 29/423* (2006.01)
*H01L 29/40* (2006.01)
*H01L 29/78* (2006.01)
*H01L 29/812* (2006.01)
*H01L 29/808* (2006.01)
*H01L 29/10* (2006.01)

(52) U.S. Cl.
CPC ........ *H01L 21/0475* (2013.01); *H01L 21/266* (2013.01); *H01L 21/26586* (2013.01); *H01L 21/28114* (2013.01); *H01L 21/3065* (2013.01); *H01L 21/67069* (2013.01); *H01L 29/1058* (2013.01); *H01L 29/1066* (2013.01); *H01L 29/404* (2013.01); *H01L 29/407* (2013.01); *H01L 29/4236* (2013.01); *H01L 29/7397* (2013.01); *H01L 29/7813* (2013.01); *H01L 29/8083* (2013.01); *H01L 29/8128* (2013.01)

(56) References Cited

U.S. PATENT DOCUMENTS

| | | | |
|---|---|---|---|
| 9,130,036 B2 * | 9/2015 | Kiyosawa | ........... H01L 21/3247 |
| 9,293,558 B2 | 3/2016 | Siemieniec et al. | |
| 9,337,040 B1 | 5/2016 | Renau | |
| 9,818,818 B2 * | 11/2017 | Rupp | .................... H01L 29/045 |
| 2002/0038886 A1 | 4/2002 | Mo | |
| 2013/0137230 A1 * | 5/2013 | Blank | .................. H01L 29/407 |
| | | | 438/270 |
| 2015/0137221 A1 * | 5/2015 | Kiyosawa | ........... H01L 21/3247 |
| | | | 257/330 |
| 2016/0172468 A1 | 6/2016 | Esteve et al. | |

FOREIGN PATENT DOCUMENTS

| | | |
|---|---|---|
| JP | 2007-512682 | 5/2007 |
| JP | 2008-085318 | 4/2008 |
| JP | 2008-205443 | 9/2008 |
| JP | 2013-219161 | 10/2013 |
| JP | 2014-107571 | 6/2014 |
| JP | 2014-179373 | 9/2014 |

OTHER PUBLICATIONS

Anthony Renau; "Evolution of Directed Ion Beam from Doping to Materials Engineering", 2014 IEEE International.

* cited by examiner

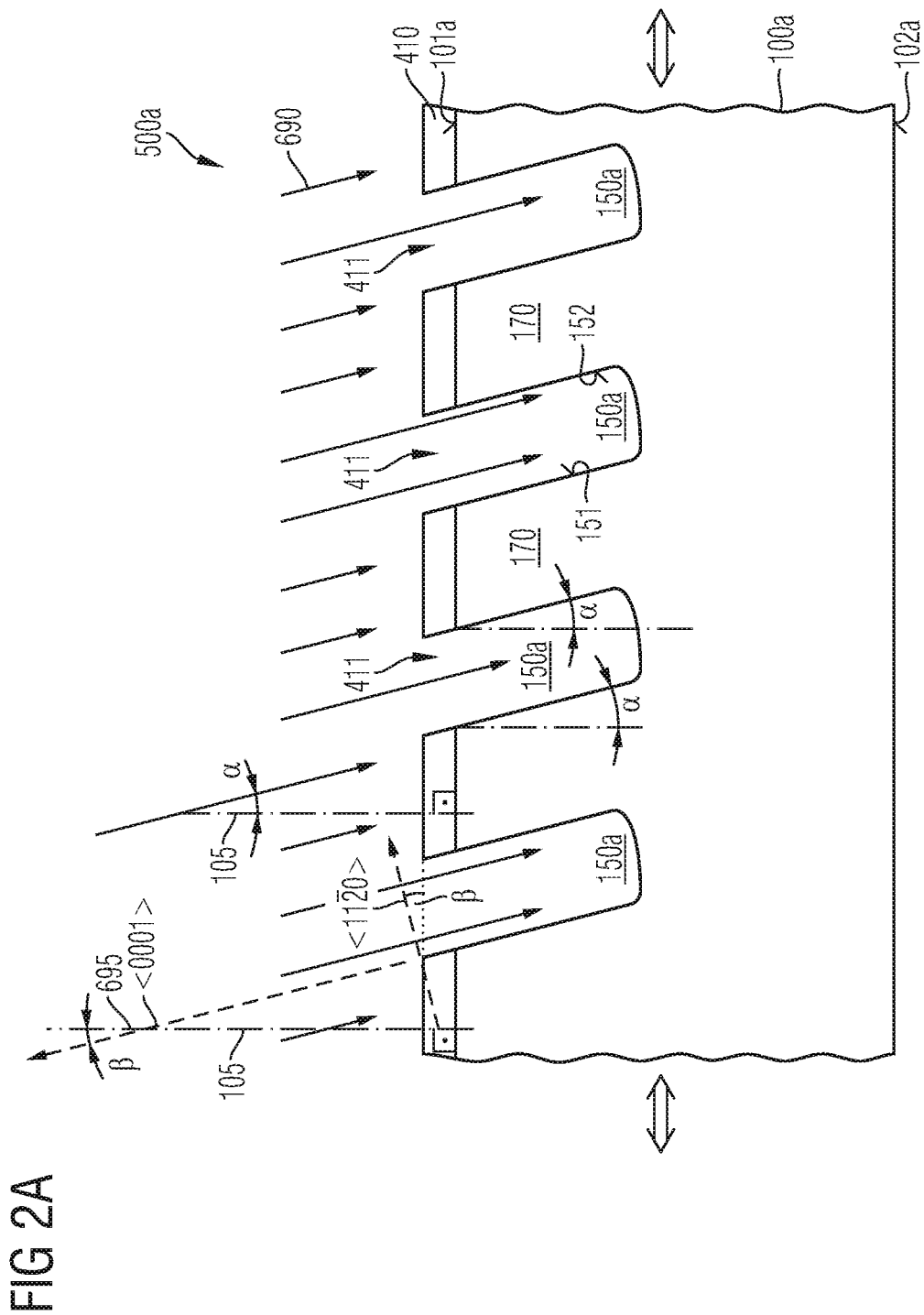

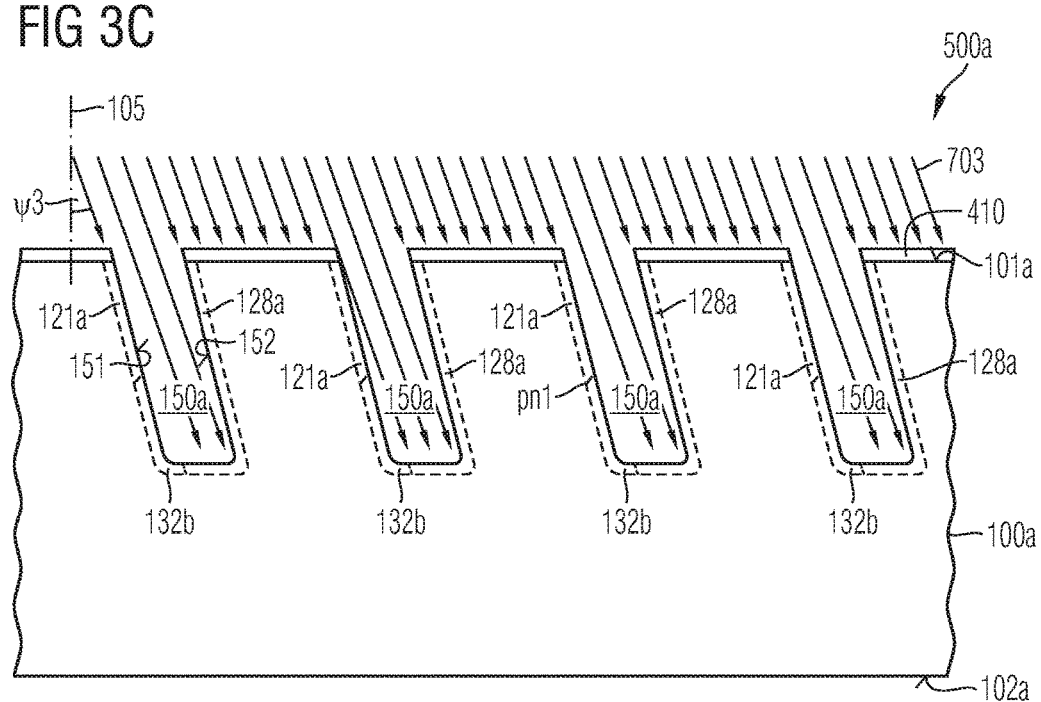
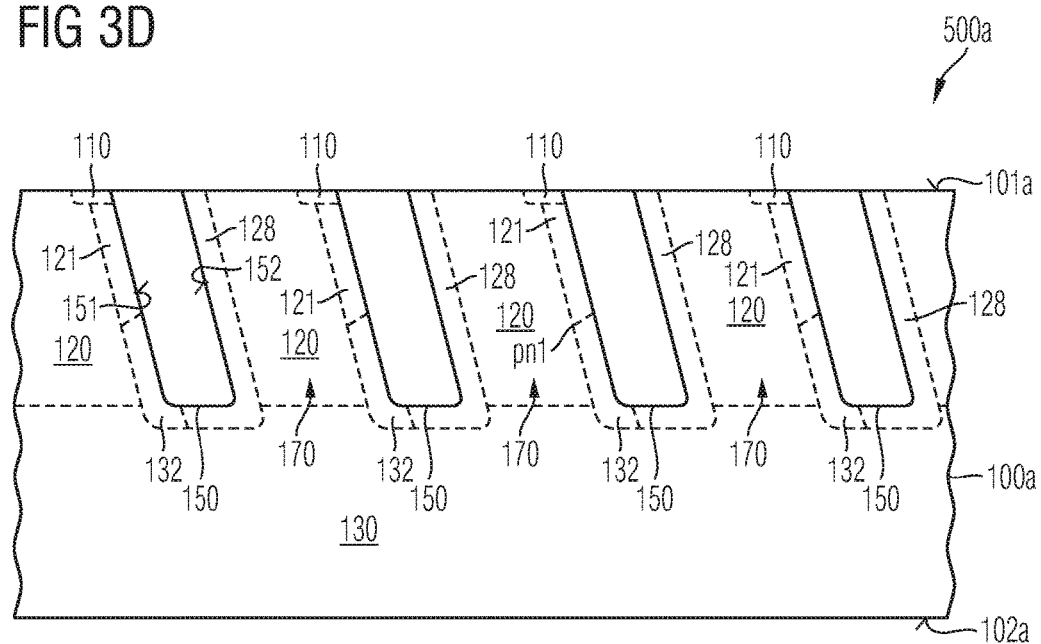

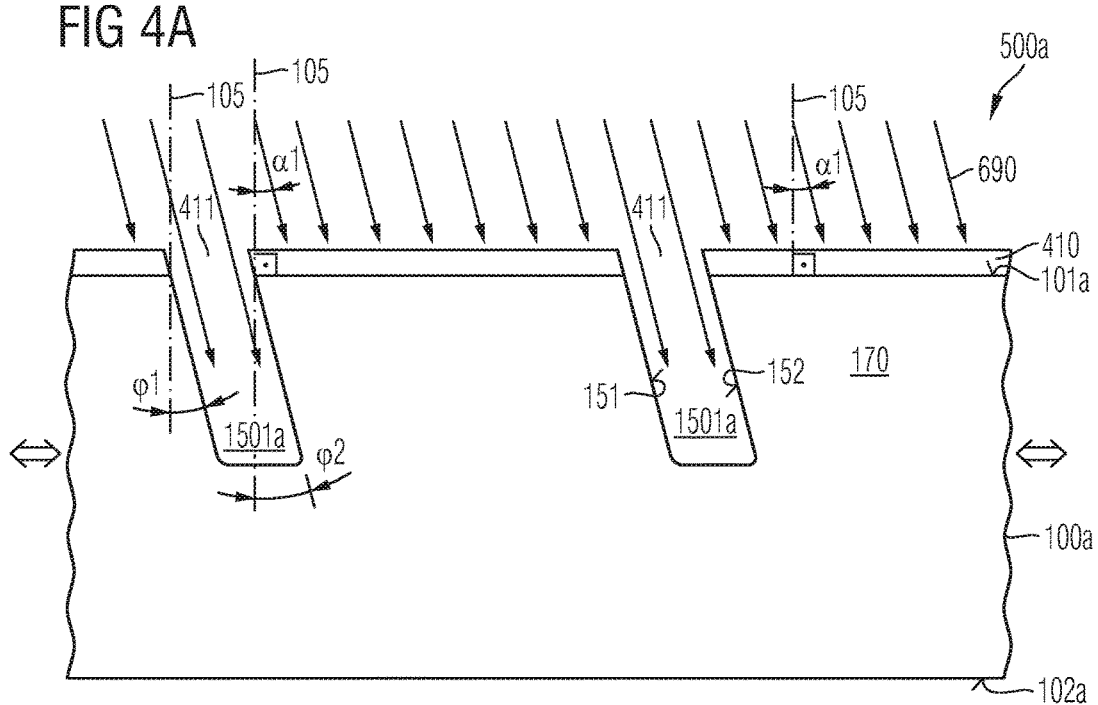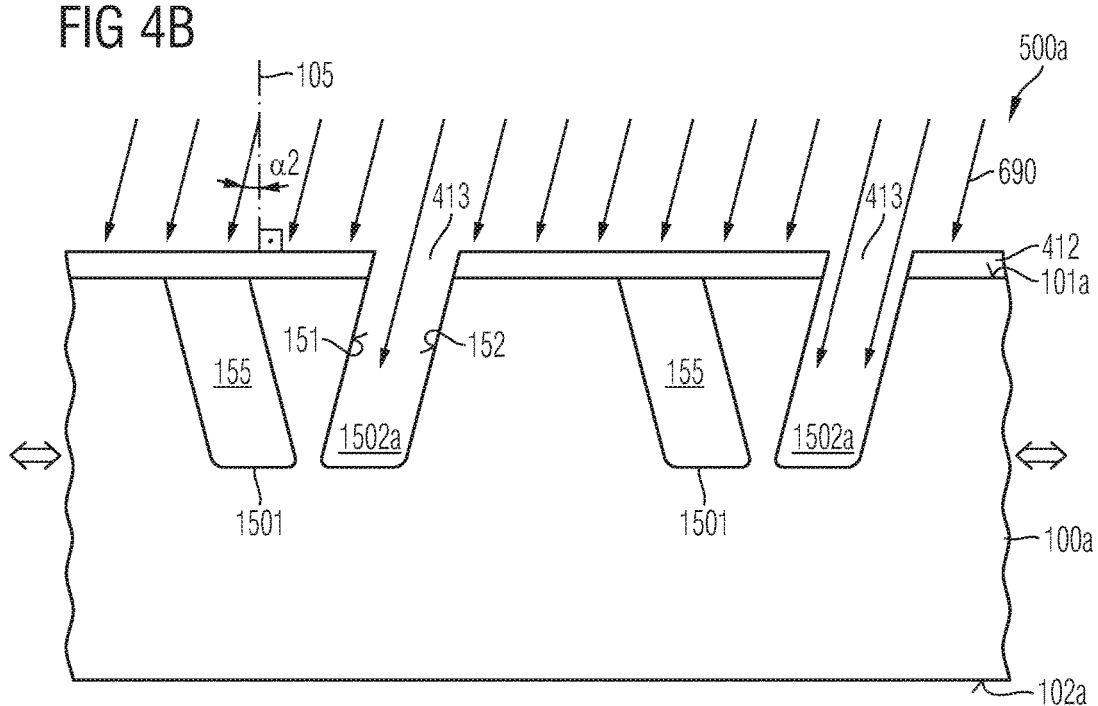

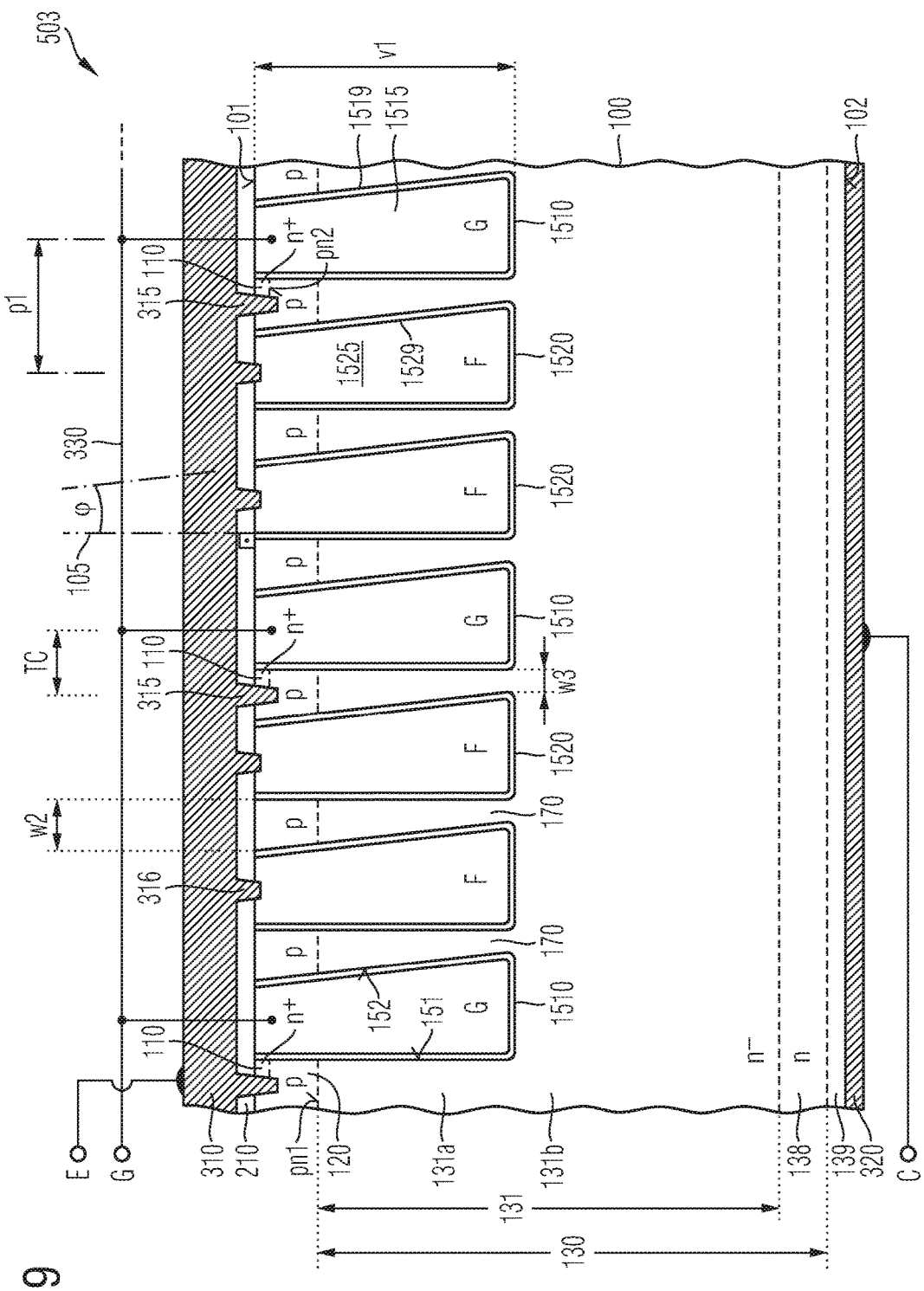

US 10,083,835 B2

FORMING ELECTRODE TRENCHES BY USING A DIRECTED ION BEAM AND SEMICONDUCTOR DEVICE WITH TRENCH ELECTRODE STRUCTURES

CROSS-REFERENCE TO RELATED APPLICATION

This Utility Patent Application claims priority to German Patent Application No. 10 2016 111 998.9 filed Jun. 30, 2016 which is incorporated herein by reference.

BACKGROUND

Power semiconductor devices with transistor cells electrically connected in parallel may include different types of electrode structures. For example, an electric potential applied to a gate electrode turns on and off the transistor cells and a suitable electric potential applied to field electrodes may improve the blocking capability and/or may shield the gate electrodes against a drain potential. Forming electrode structures in trenches that extend into the semiconductor die allows for shrinking the lateral dimensions of the transistor cells and improves area efficiency of power semiconductor devices.

It is desirable to further improve characteristics of semiconductor devices that include electrode structures formed in trenches.

SUMMARY

According to an embodiment, an ion beam with a beam divergence θ is directed on a process surface of a semiconductor substrate to form parallel electrode trenches in the semiconductor substrate. A center axis of the ion beam is tilted to a normal on the process surface at a tilt angle α, wherein at least one of the tilt angle α and the beam divergence θ is not equal to zero. During formation of the electrode trenches, the semiconductor substrate is moved along a direction parallel to the process surface. A conductive electrode is formed in the electrode trenches. First sidewalls of the electrode trenches are tilted to the normal by a first slope angle φ1=α+θ/2. Second sidewalls are tilted to the normal by a second slope angle φ2 with φ2=α−θ/2.

According to another embodiment a semiconductor device includes a trench gate structure that extends from a first surface into a semiconductor portion. A first sidewall and an opposite second sidewall of the trench gate structure are parallel to each other and the trench gate structure is tilted to a normal to the first surface by a slope angle φ. In a mesa section of the semiconductor portion at least one sidewall implant zone directly adjoins to the trench gate structure, wherein the sidewall implant zone is selectively formed along one of the first and second sidewalls.

According to a further embodiment a semiconductor device includes electrode structures that extend from a first surface into a semiconductor portion. Parallel first sidewalls of the electrode structures are vertical to the first surface. Parallel second sidewalls opposite to the first sidewalls are tilted to a normal to the first surface by a slope angle φ greater than 0°. Body regions are formed in mesa sections of the semiconductor portion between the electrode structures. In the mesa sections the body regions form first pn junctions with a drain structure and second pn junctions with source regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

FIG. 2A is a schematic vertical cross-sectional view of a portion of a semiconductor substrate for illustrating a method of manufacturing a semiconductor device according to an embodiment related to formation of electrode structures with sidewalls parallel to non-vertical main crystal planes, during formation of electrode trenches.

FIG. 3C is a vertical cross-sectional view of the semiconductor substrate portion of FIG. 3B, during a third implant into second sidewalls opposite to the first sidewalls.

FIG. 3D is a vertical cross-sectional view of the semiconductor substrate portion of FIG. 3C, after forming electrode structures in the electrode trenches.

FIG. 4A is a schematic vertical cross-sectional view of a portion of a semiconductor substrate for illustrating a method of manufacturing a semiconductor device according to an embodiment using two successive etching processes with symmetrically tilted directed ion beams, during application of a first directed ion beam.

FIG. 4B is a schematic vertical cross-sectional view of the semiconductor substrate portion of FIG. 4A, during application of a second directed ion beam.

FIG. 9 is a schematic perspective view of a portion of a semiconductor device according to an embodiment related to an IGBT (insulated gate bipolar transistor) with narrowed mesa sections.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection through a metal and/or a heavily doped semiconductor. The term "electrically coupled" includes that one or more intervening element(s) adapted for signal transmission may be provided between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1E refer to a method of forming oblique trench electrode structures by directed ion beam etching.

Figure 1A:
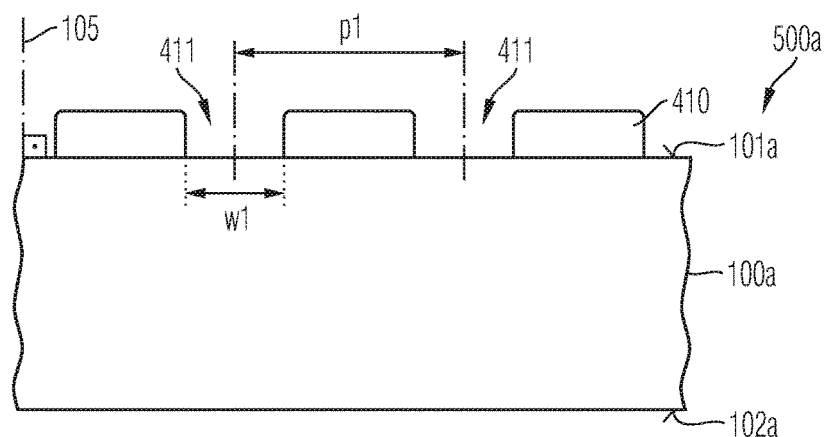
FIG. 1A is a schematic vertical cross-sectional view of a portion of a semiconductor substrate for illustrating a method of manufacturing a semiconductor device according to an embodiment, after forming an etch mask.

FIG. 1A shows a semiconductor substrate 500a including an etch mask 410 formed by photolithography on a process surface 101a at a front side of a semiconductor base 100a. The semiconductor base 100a is of crystalline semiconductor material, e.g., silicon (Si), germanium (Ge), silicon germanium (SiGe), silicon carbide (SiC) or an $A_{III}B_V$ semiconductor such as gallium nitride (GaN), by way of example. The semiconductor base 100a may be or may include a semiconductor wafer obtained from a crystal ingot by sawing. The semiconductor base 100a may include one or more epitaxial semiconductor layers, which may contain homogeneously distributed dopants or which may include horizontally and/or vertically patterned doped regions.

The process surface 101a may be planar or may be staggered, wherein parallel second surface sections connect parallel first surface sections. A support surface 102a on the back of the semiconductor base 100a is parallel to a planar process surface 101a or parallel to a mean surface plane of a staggered process surface 101a. A normal 105 to a planar process surface 101a or to a mean surface plane of a staggered process surface 101a defines a vertical direction. Directions orthogonal to the vertical direction are horizontal directions.

The etch mask 410 may be from one single material or may be a stack of layers from different materials such as silicon nitride, silicon oxynitride, silicon oxide, e.g. thermally grown silicon oxide or deposited oxide, for example TEOS-oxide (silicon oxide formed by using tetraethyl orthosilane as precursor) or carbon.

The horizontal cross-sections of the mask openings 411 may be stripes with a horizontal length exceeding more than ten times a horizontal width or may be dots with two orthogonal horizontal widths within the same order of magnitude, e.g., approximately equal horizontal widths such as circles or squares with rounded or beveled corners.

According to an embodiment the mask openings 411 may form a regular pattern of parallel equidistant stripes, wherein longitudinal axes of the stripes extend vertical to the cross-sectional plane. A horizontal width w1 of the mask openings 411 may be in a range from 50 nm to 50 μm, for example, from 100 nm to 2 μm or from 2 μm to 10 μm. A center-to-center distance (p1) between neighboring mask openings 411 may be in a range from 50 nm to 80 μm, for example 100 nm to 2 μm or 2 μm to 50 μm or 3 μm to 30 μm.

Figure 1B:
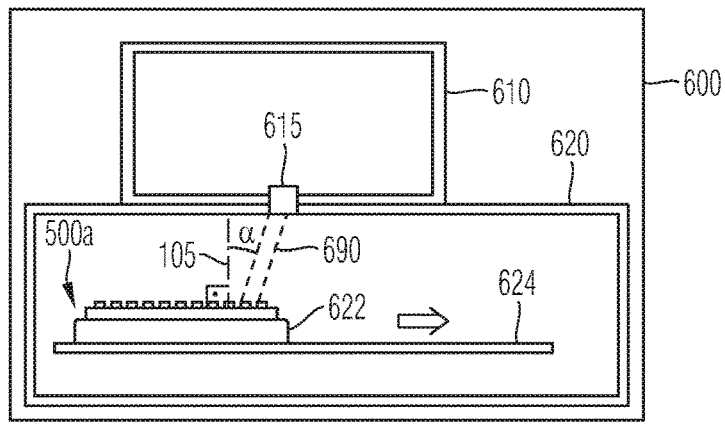
FIG. 1B is a schematic diagram illustrating movement of the semiconductor substrate of FIG. 1A relative to a directed ion beam that is tilted to a normal to a process surface of the semiconductor substrate.

The semiconductor substrate 500a is transferred to a directed ion beam apparatus 600 as shown in FIG. 1B.

The directed ion beam apparatus 600 may include a plasma unit 610 generating and accelerating ions. For example, the plasma unit 610 generates electrons and accelerates the electrons between a cathode and an anode electrode, wherein the electrons ionize atoms of a noble gas like argon (Ar). The plasma unit 610 shapes the generated ions to a directed ion beam 690 with a defined cross-sectional shape.

The cross-sectional shape of the directed ion beam 690 may be approximately round or oval. According to an embodiment the horizontal cross-section of the directed ion beam 690 is a ribbon with a longitudinal axis extending in a direction orthogonal to the cross-sectional plane, wherein a longitudinal extension of the ribbon is greater than a horizontal diameter of the semiconductor substrate 500a and wherein a horizontal width of the ribbon is in a range up to several millimeters.

A deflection unit 615 passes the directed ion beam 690 to a process unit 620, where the directed ion beam 690 impinges on the process surface 101a of the semiconductor substrate 500a.

In the process unit 620 the semiconductor substrate 500a is placed on a holder 622 which may apply to the semiconductor substrate 500a a potential attracting the ions in the directed ion beam 690. A conveyer unit 624 moves the holder 622 and the semiconductor substrate 500a along a direction parallel to the process surface 101a such that the directed ion beam 690 successively scans the complete process surface 101a at a same impact angle and at the same distance with reference to the deflection unit 615.

The directed ion beam 690 may have a beam divergence θ>0, may be non-divergent with the beam divergence θ=0, or may be bi-directional with two non-diverging beam components whose central axes are symmetrically tilted to the normal 105 to the process surface 101a.

The deflection unit 615 guides the directed ion beam 690 in a way such that the directed ion beam 690 does not impinge vertically on the process surface 101a of the semiconductor substrate 500a if θ=0. For a beam divergence θ>0, a tilt angle α between a beam axis 695 of a ribbon-shaped directed ion beam 690 and the normal 105 to the process surface 101a may be equal to θ/2 such that one of the slopes of the ribbon-shaped directed ion beam 690 is vertical to the process surface 101a. According to another embodiment related to a beam divergence 0 greater 0, the tilt angle α is equal to zero, such that opposite first and second slopes of the ribbon-shaped directed ion beam 690 are tilted symmetrically with respect to the center plane of the ribbon-shaped directed ion beam 690.

The semiconductor substrate 500a may be moved during application of the directed ion beam 690 or may be moved during periods in which the directed ion beam 690 is temporarily blanked out or suppressed.

The plasma unit 610 and the process unit 620 may include separated chambers, wherein the deflection unit 615 passes the directed ion beam 690 from the plasma chamber to the process chamber and wherein further gaseous reactants may be supplied to the process chamber. According to other embodiments, the plasma unit 610 and the process unit 620 may share the same chamber.

Figure 1C:
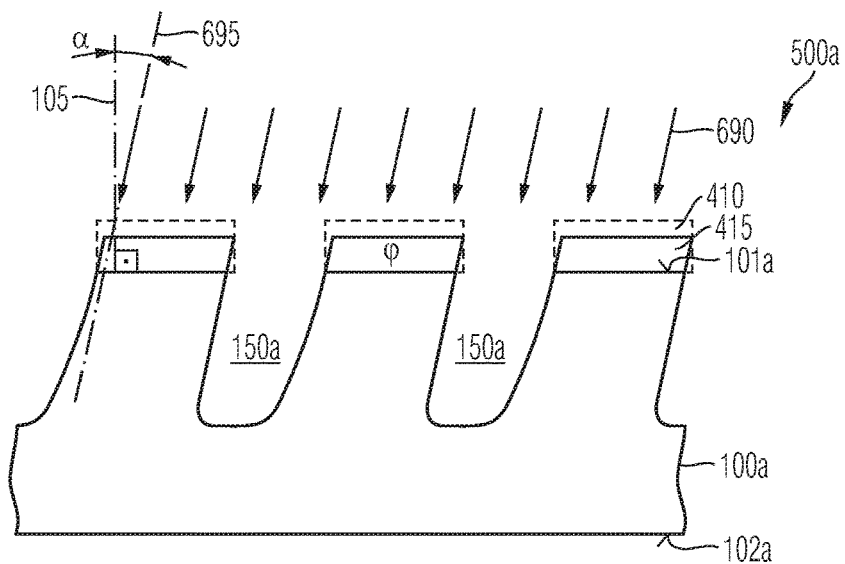
FIG. 1C is a schematic cross-sectional view of the semiconductor substrate portion of FIG. 1A in the directed ion beam of FIG. 1B.

FIG. 1C shows the directed ion beam 690 impinging on the semiconductor substrate 500a at the tilt angle α with respect to the normal 105 to the process surface 101a. In the illustrated embodiment, the directed ion beam 690 does not diverge and the tilt angle α is not equal zero. For example, the tilt angle α is at least 4°. According to other embodiments, the tilt angle α is in a range from 50° to 60° or in a range between 8° to 30°.

The ions impinging through the mask openings 411 of the etch mask 410 on exposed portions of the semiconductor base 100a release portions of the semiconductor base 100a either by momentum transfer or by a combination of momentum transfer and chemical processes that use etchants and plasma energy to cause a chemical reaction dissolving the semiconductor material exposed to the directed ion beam 690. For example, chlorine or fluorine based etchants such as $CF_4$ or mixtures containing HBr and/or $Cl_2$ may be a fed to the process unit 620 during application of the directed ion beam 690.

As shown in FIG. 1C the directed ion beam 690 forms electrode trenches 150a in regions of the semiconductor base 100a exposed by the mask openings 411. The directed ion beam 690 may also consume a portion of the etch mask 410 such that at a stage when the electrode trenches 150a are completed the original etch mask 410 is reduced to a partially consumed etch mask 415. In some embodiments, the etch mask 410 may not be consumed by the directed ion beam 690 and remain as originally formed. Due to the tilted etch, the mask edges which define the trench etch will change their form from a rectangular shape to a mask with tilted sidewalls. This can also influence the shape at the upper part of the trench depending on the ratio of the etch rate of the mask and of the semiconductor substrate. A depth of the electrode trenches 150a may be in a range from 1 μm to 10 μm, for example 3 μm to 7 μm.

Figure 1D:
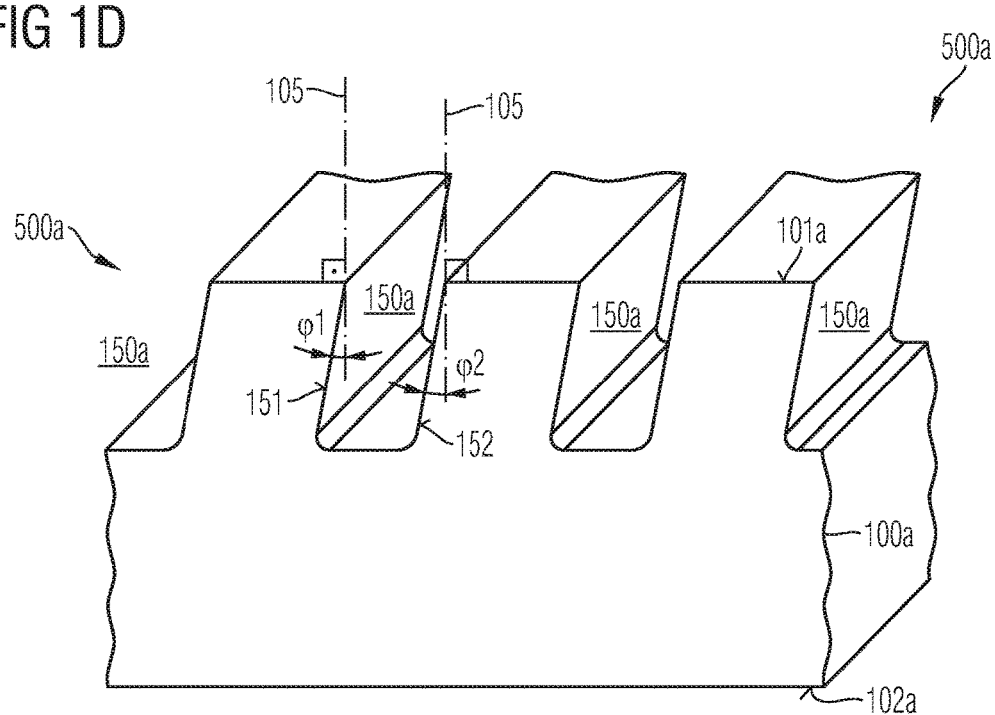
FIG. 1D is a schematic vertical cross-sectional view of the semiconductor substrate portion of FIG. 1C, after forming electrode trenches by directed ion beam etching.

FIG. 1D shows the semiconductor substrate 500a after removing the partially consumed etch mask 415 of FIG. 1C. A slope angle φ1 of the first sidewall 151 with respect to the normal 105 is symmetric to a slope angle φ2 of an opposite second sidewall 152 with respect to the normal 105 with φ1=−φ2.

In the electrode trenches 150a at least portions of electrodes for transistor cells or contact structures forming ohmic contacts with electrodes of transistor cells are formed, wherein the transistor cells may be, e.g., JFET (junction field effect transistor) cells or IGFET (insulated gate field effect transistor) cells. Forming the electrodes may include implanting dopants into at least one of the first and second sidewalls 151, 152 to form implant zones and filling the electrode trenches 150a either with a contact material forming an ohmic contact with the implanted zones or with a conductive material insulated from the semiconductor base 100a.

Figure 1E:
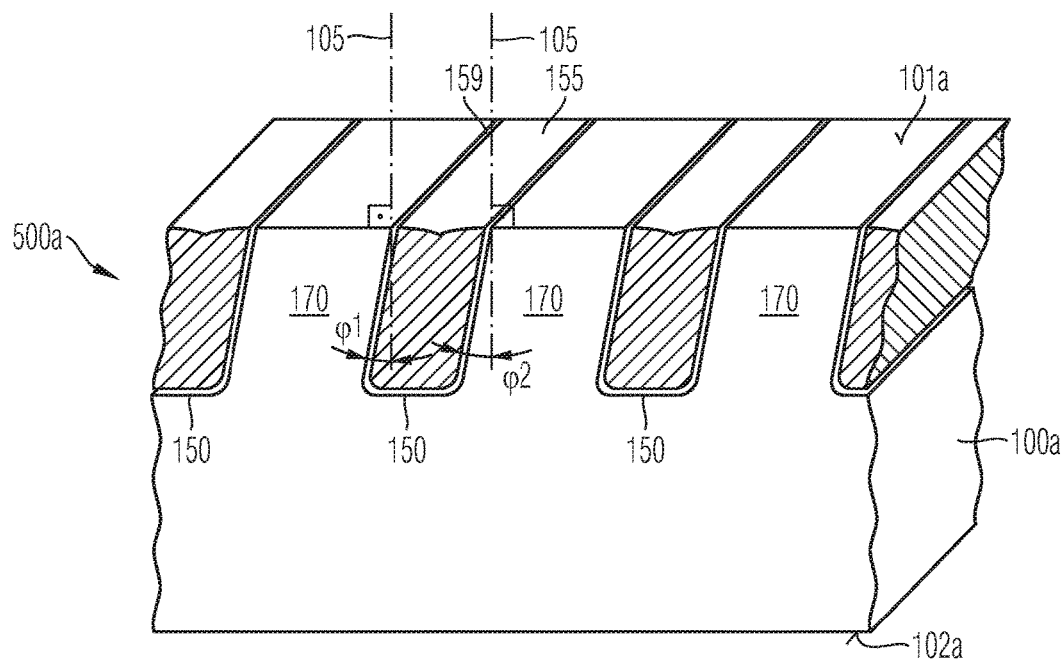
FIG. 1E is a schematic vertical cross-sectional view of the semiconductor substrate portion of FIG. 1D, after forming electrode structures in the electrode trenches.

FIG. 1E refers to an embodiment with an insulated electrode structure 150 formed in the electrode trenches 150a of FIG. 1D, wherein the insulated electrode structure 150 includes a conductive electrode 155, which may be from heavily doped polycrystalline silicon or which may include two or more layers from different conductive materials, e.g., titanium nitride (TiN), titanium tungsten (TiW), tantalum nitride (TaN), aluminum (Al), copper (Cu), and tungsten (W) or combinations of one or more metal layers with polysilicon.

The conductive electrode 155 may be electrically connected to a load terminal, e.g., to the source terminal of an IGFET or JFET or to an emitter terminal of an IGBT or to a control electrode, for example the gate electrode of an IGFET, JFET or IGBT.

An electrode dielectric 159 may separate the conductive electrode 155 from the semiconductor base 100a. For JFET cells the electrode dielectric 159 is absent and the conductive electrode 155 may directly adjoin to mesa sections 170 of the semiconductor base 100a between neighboring electrode structures 150, wherein the mesa sections 170 may include semiconducting portions of IGFET cells or JFET cells.

Figure 2B:
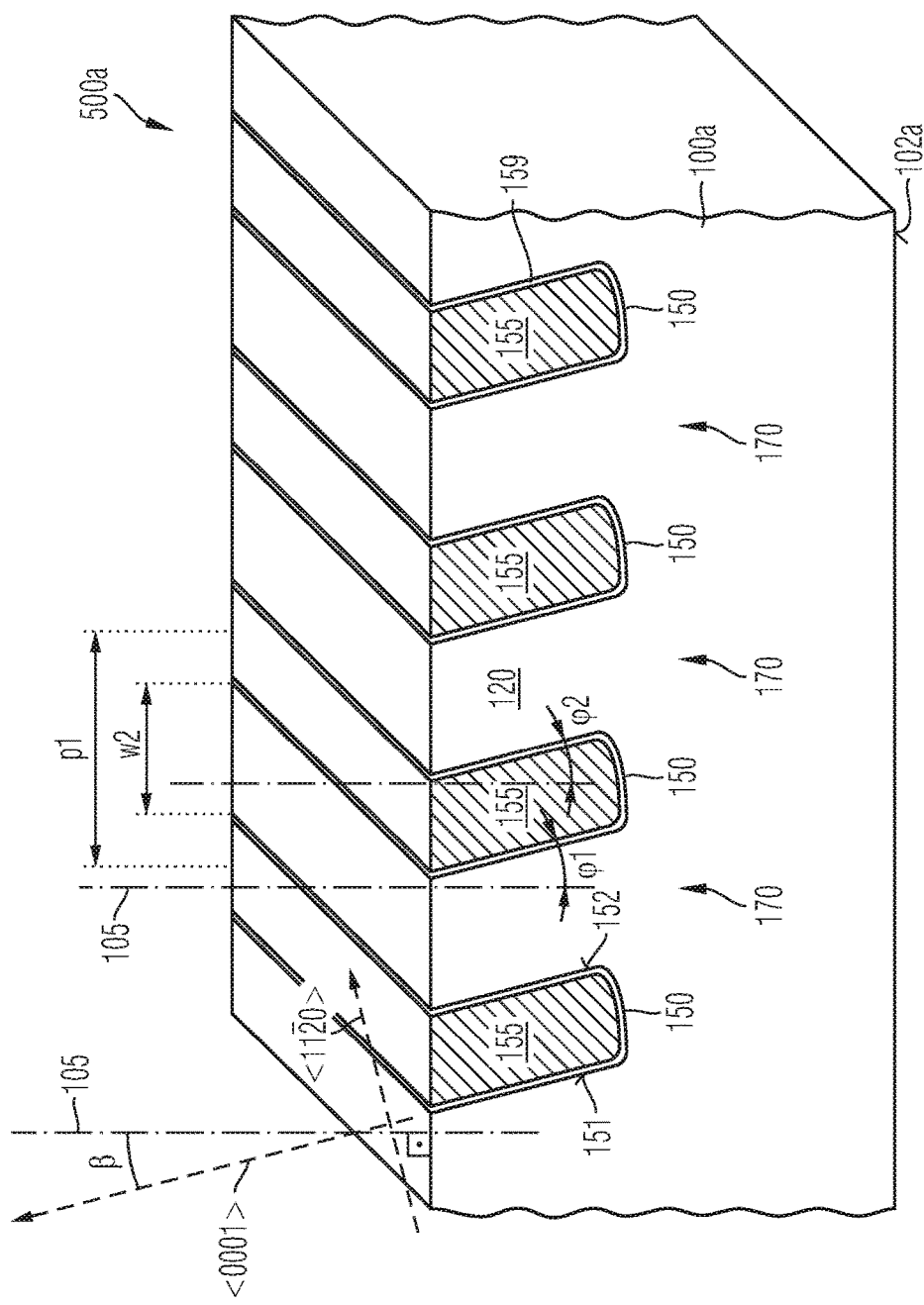
FIG. 2B is a schematic perspective view of the semiconductor substrate portion of FIG. 2A, after forming electrode structures in the electrode trenches.

FIGS. 2A and 2B refer to a method of manufacturing semiconductor devices based on a semiconductor material with a hexagonal crystal lattice, wherein a directed ion beam etches electrode trenches 150a with at least the first sidewalls 151 parallel to a main crystal plane.

In FIG. 2A a semiconductor substrate 500a includes a semiconductor base 100a from a semiconductor material with hexagonal crystal lattice such as silicon carbide (SiC) or gallium nitride (GaN). For example, the semiconductor material is 2H—SiC (SiC of the 2H polytype), 6H—SiC or 15R—SiC. According to an embodiment the semiconductor material is 4H—SiC. The semiconductor base 100a may include a base portion obtained from a silicon carbide ingot, e.g., by sawing, and one or more epitaxial layers grown on the base portion.

A process surface 101a at a front side of the semiconductor base 100a and a support surface 102a opposite to the front side are oriented parallel to each other. A main crystal direction, e.g., the <0001> crystal axis is tilted by an off-axis angle $\beta>0$ to the normal 105 to a horizontal plane. Another main crystal direction, e.g., the <11-20> crystal axis is tilted by the off-axis angle $\beta$ with respect to the horizontal plane and the <1-100> crystal axis is orthogonal to the cross-sectional plane. According to another embodiment the <1-100> crystal axis is tilted by the off-axis angle $\beta$ with respect to the horizontal plane and the <11-20> crystal axis is orthogonal to the cross-sectional plane.

The process surface 101a may be serrated and may include parallel first surface sections shifted to each other and tilted to the horizontal plane by the off-axis angle $\beta$ as well as second surface sections tilted to the first surface sections and connecting the first surface sections, such that a cross-sectional line of the serrated process surface 101a in the cross-sectional plane approximates a saw-tooth line and a mean surface plane is parallel to the horizontal plane. According to other embodiments, the process surface 101a is planar. A distance between the process surface 101a at the front side and the support surface 102a on the back is related to a nominal blocking capability of the semiconductor devices obtained from the semiconductor substrate 500a at a later stage. A total thickness of the semiconductor base 100a between the process surface 101a and the support surface 102a may be in the range of several hundred nm to several hundred μm or in a range between 4 μm and 200 μm.

An etch mask 410 with mask openings 411 is formed on the process surface 101a. Sidewalls of the mask openings 411 may be approximately vertical or may be chamfered in an auxiliary process using a directed ion beam and etchants selectively removing the material of the etch mask 410.

A non-divergent directed ion beam 690 may be directed onto the semiconductor substrate 500a parallel to the <0001> crystal axis, i.e., with a tilt angle α equal to the off-axis angle $\beta$. During the implant, e.g., while the directed ion beam 690 impinges on the semiconductor substrate 500a or in idle periods between successive implantation periods, the semiconductor substrate 500a is moved along a horizontal direction parallel to the process surface 101a such that the distance between the process surface 101a and the source of the directed ion beam 690 remains almost the same for the implant across the complete process surface 101a. For example, a deviation of a distance between the process surface 101a and a virtual beam source, for example, the deflection unit 615 of FIG. 1B across the semiconductor substrate 500 is less than 10 mm, e.g., less than 5 mm, for example even less than 1 mm or less than 100 nm.

The impinging directed ion beam 690, optionally in combination with gaseous etchants, forms electrode trenches 150a in the semiconductor base 100a, wherein sidewalls 151, 152 of the electrode trenches 150a are main crystal planes, e.g., (11-20) crystal planes, in which charge carrier mobility is high compared to other crystal planes. The bottom of the electrode trenches 150a may be parallel to the process surface 101a, orthogonal to the beam axis 695 or may have a shape bounded by a horizontal plane and a plane orthogonal to the beam axis 695.

An electrode dielectric 159 may be formed that lines at least the first and second sidewalls 151, 152 of the electrode trenches 150a. For example, a heating treatment in an oxygen-containing ambient may form a thermal silicon oxide that completely lines the electrode trenches 150a. Remnants of the etch mask 410 are removed after or before formation of the electrode dielectric 159, wherein the process surface 101a is cleared.

One or more conductive materials are deposited that fill the electrode trenches 150a. Portions of the conductive materials deposited outside of the electrode trenches 150a are removed.

FIG. 2B shows electrode structures 150 that may form trench gate structures in the electrode trenches 150a. A conductive electrode 155 may form a gate electrode and an electrode dielectric 159 may form a gate dielectric.

Conventional approaches for asymmetric transistor cells in SiC substrates with an off-axis orientation of the <11-20> crystal axis provide trench gate structures that taper with increasing distance to the surface. Compared to trench gate structures with tapering sidewalls, the parallel, but tilted first and second sidewalls 151, 152 leave a significantly larger top mesa width w2 at the process surface 101a for a given center-to-center distance p1 between neighboring electrode structures 150 and a given width of the electrode structures 150 at the bottom.

Patterning processes, for example, for forming electric contacts selectively to the mesa sections 170 or for forming asymmetric doped regions selectively in portions of the top surface of the mesa sections 170 define a lower limit for the top mesa width w2. At a given top mesa width w2, the electrode structures 150 of FIG. 2B can be arranged at a smaller center-to-center distance p1 and allow for semiconductor devices with higher area efficiency.

Compared to approaches holding an SiC substrate in a tilted position to a flat electrode of a dry etching apparatus, the distance between the process surface 101a and the ion beam source remains the same across the complete process surface 101a such that shape, depth and width variations of the trench gate structures 1510 across the semiconductor substrate 500a of FIG. 2A are comparatively low.

FIGS. 3A to 3D refer to the formation of implant zones for asymmetric transistor cells in semiconductor substrates with hexagonal crystal lattice and with an off-axis angle $\beta$ of a main crystal axis with respect to a horizontally oriented process surface 101a, wherein $\beta>0$.

According to FIG. 3A electrode trenches 150a with first sidewalls 151 parallel to a main crystal plane, e.g., the (11-20) crystal plane or the (1-100) crystal plane are formed in a semiconductor substrate 500a as described with reference to FIG. 2A.

First dopant ions 701 may be implanted selectively through the first sidewalls 151 at a first implant angle ψ1 between the beam axis 695 of the directed ion beam 690 and the normal 105 to the process surface 101a. The first implant angle ψ1 may be 0° such that the implant is vertical. The mesa sections 170 shield the second sidewalls 152 and a part of the bottom portion against the impinging first dopant ions 701, which may be of the charge type corresponding to the conductivity type of body regions or to the conductivity type of source regions. In the illustrated embodiment, the first dopant ions 701 have the charge type of the dopants in source regions. The first dopant ions 701 form precursor implant zones 132a along the first sidewalls 151 of the electrode trenches 150a.

Figure 3A:
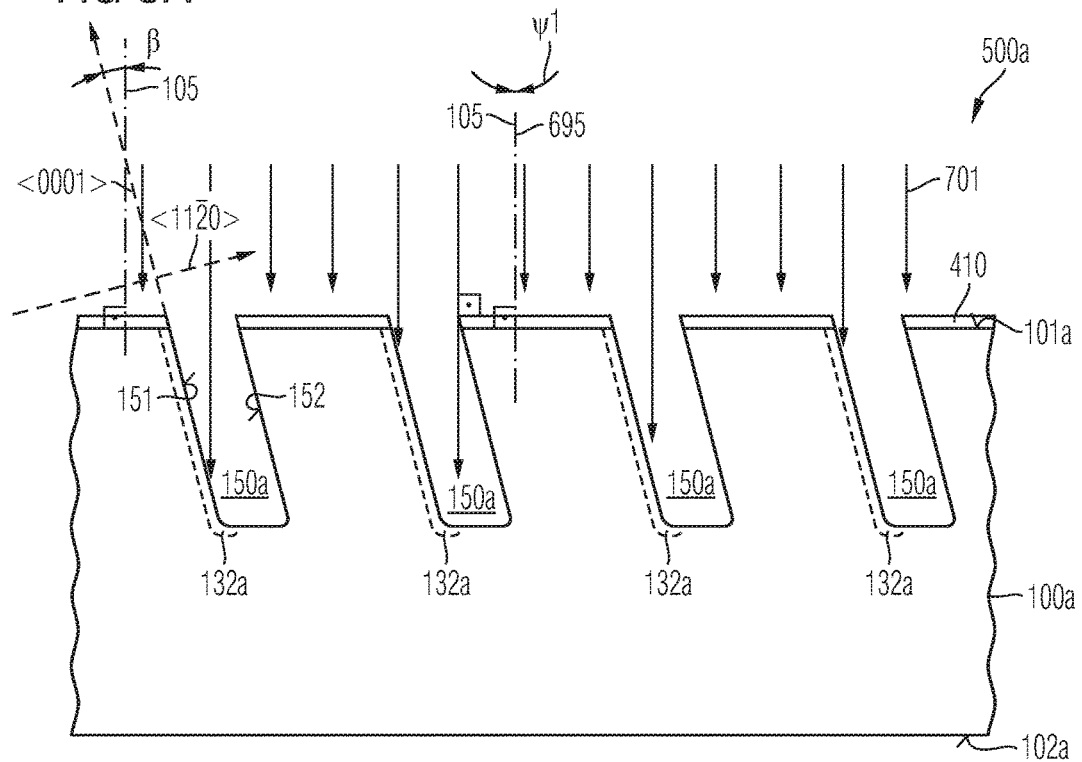
FIG. 3A is a schematic vertical cross-sectional view of a portion of a semiconductor substrate for illustrating a method of manufacturing a semiconductor device according to an embodiment using sidewall implantation, during a first implant into first sidewalls of electrode trenches.
Figure 3B:
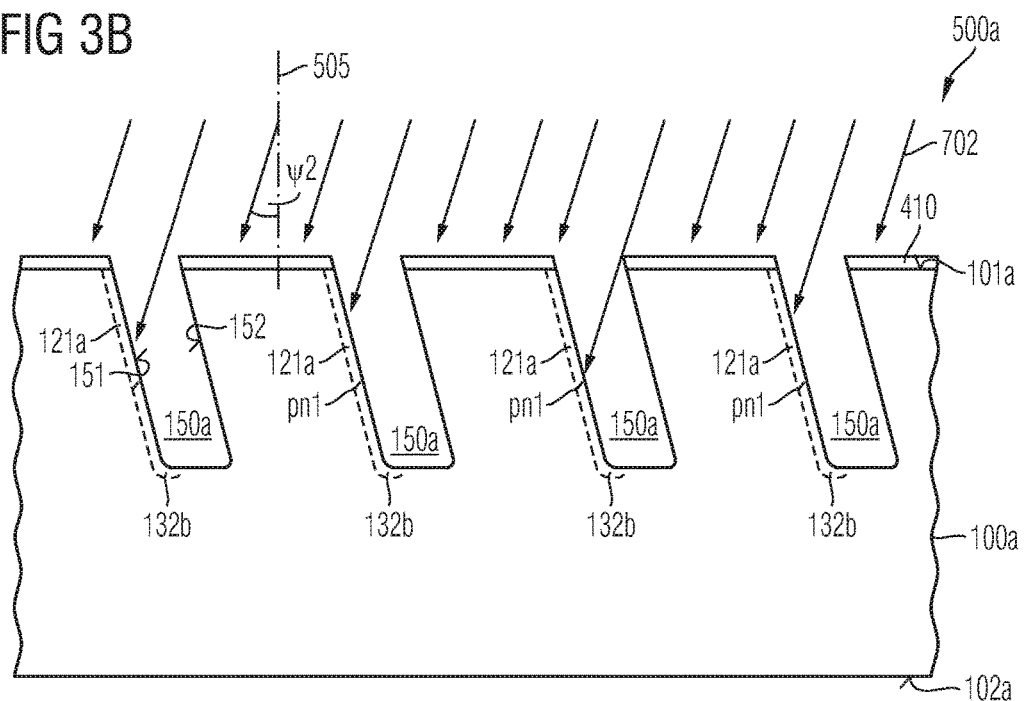
FIG. 3B is a vertical cross-sectional view of the semiconductor substrate portion of FIG. 3A, during a second implant into portions of the first sidewalls.

FIG. 3B concerns an implant of second dopant ions 702 at a second implant angle ψ2 of the beam axis 695 with respect to the normal 105, wherein the mesa sections 170 selectively shield lower portions of the first sidewalls 151 oriented to the support surface 102a against and expose upper portions of the first sidewalls 151 to the second dopant ions 702. The second dopant ions 702 have of a charge type opposite to that of the first dopant ions 701 and overcompensate the first dopant ions 701 in channel implant zones 121a along the upper sections of the first sidewalls 151. The remaining lower sections of the precursor implant zones 132a, which are oriented to the support surface 102a, form junction implant zones 132b. The structures realized as described in FIG. 3A and 3B allow e.g. the cost-effective realization of floating p-well regions for IGBTs. Usually very long diffusion times and high diffusion temperatures are required for the formation of floating p-wells surrounding the bottom of the gate trenches.

FIG. 3C concerns implantation of third dopant ions 703 of the charge type of the second dopant ions 702 at a third implant angle ψ3 between the beam axis 695 and the normal 105 to form shielding implant zones 128a along the second sidewalls 152 and along at least a part of the bottom portion of the electrode trenches 150a. A thermal treatment of the semiconductor substrate 500a may anneal implant damages and may to some degree diffuse the implanted first, second and third dopant ions 701, 702, 703.

FIG. 3D shows body regions 120 including channel regions 121 formed from the dopants in the channel implant zones 121a of FIG. 3A and extending at approximately uniform width along the first sidewalls 151. Junction regions 132 formed from the dopants in the junction implant zones 132b of FIG. 3B directly adjoining to the channel regions 121 and improve the electric connection of the inversion channels temporarily formed in the channel regions 121. Shielding regions 128 formed from the dopants in the shielding implant zones 128a of FIG. 3C extend at approximately uniform width along the second sidewalls 152 and may directly adjoin to the junction region 132.

Electrode structures 150, e.g., trench gate structures may be formed in the electrode trenches 150a as described with reference to FIG. 2B. Source regions 110 may be formed in mesa sections 170 of the semiconductor base 100a. A drain structure 130 may be formed between the electrode structures 150 and the support surface 102a.

The implants shown in FIGS. 3A to 3C may be combined as illustrated. Other embodiments include only one of the implants or combine two of the implants through sidewalls of the electrode trenches 150a with other methods of forming shielding regions 128, channel regions 121, and junction regions 132. Each of the implants may be one single implant or may be a combination of several implants with slightly varying implant angle and/or varying dopant concentration.

The junction regions 132 close to the end of the inversion channels avoid accumulation of negative charge during the on-state, wherein the accumulated negative charge may result from the high amount of electrons passing the channel regions 121 and spilling into the drain structure 130. Variation of the implantation angles of implants along the first sidewalls 151 may be used to vary the n-doping over the depth of the electrode trenches 150a. For example, in a portion of the junction region 132 directly adjoining to the channel regions 121 the dopant dose may be higher than at a greater distance to the channel regions 121.

Other embodiments may use tilted implants for forming compensation structures. A further embodiment concerns a vertical junction termination based on a vertical variation of a doping concentration, wherein the vertical variation is achieved by partial absorption of vertically implanted ions by a craning section of a mesa section 170.

Non-divergent directed ion beams tilted to the normal 105 to the process surface 101a, divergent directed ion beams and/or bi-directional ion beams may be used to shrink the horizontal dimension of the mesa sections 170 between trench electrode structures.

The method illustrated in FIGS. 4A to 4B uses two successively applied non-divergent directed ion beams 690 to form electrode trenches with vertical axes tilted to each other.

An etch mask 410 with mask openings 411 is formed on the process surface 101a of a semiconductor base 100a. The semiconductor substrate 500a is moved along a direction parallel to the process surface 101a. A directed ion beam 690 impinges at a first tilt angle α1 with respect to a normal 105 to the process surface 101a.

As shown in FIG. 4A, the directed ion beam 690 forms electrode trenches 1501a with first and second sidewalls 151, 152 tilted to the process surface 101a by the first tilt angle α1.

The electrode trenches 1501a are closed, e.g., by a sacrificial fill or by forming first electrode structures 1501 as shown in FIG. 4B, by way of example.

A supplemental etch mask 412 is formed with mask openings 413 between the first electrode structures 1501. A supplementary directed ion beam 690 is directed to the semiconductor substrate 500a at a tilt angle α2 to the normal. The tilt angle α2 may be 0° such that the supplementary directed ion beam 690 impinges vertically on the process surface 101a.

In the embodiment illustrated in FIG. 4B the tilt angle α2 is equal to −α1 and forms second electrode trenches 1502a, wherein first and second sidewalls 151, 152 of the second electrode trenches 1502a and of the first electrode structures 1501 are tilted symmetrically with respect to the normal.

The supplemental etch mask 412 may be removed and second trench electrode structures are formed in the second electrode trenches 1502a. A conductive electrode 155 of both electrode structures may be electrically connected to the same device terminal or to different device terminals. For example, the conductive electrode 155 may be electrically connected to a control terminal of a JFET or some of the first and second trench electrode structures may be electrically connected to a gate terminal of an IGBT and others to a load terminal of the IGBT.

Figure 5A:
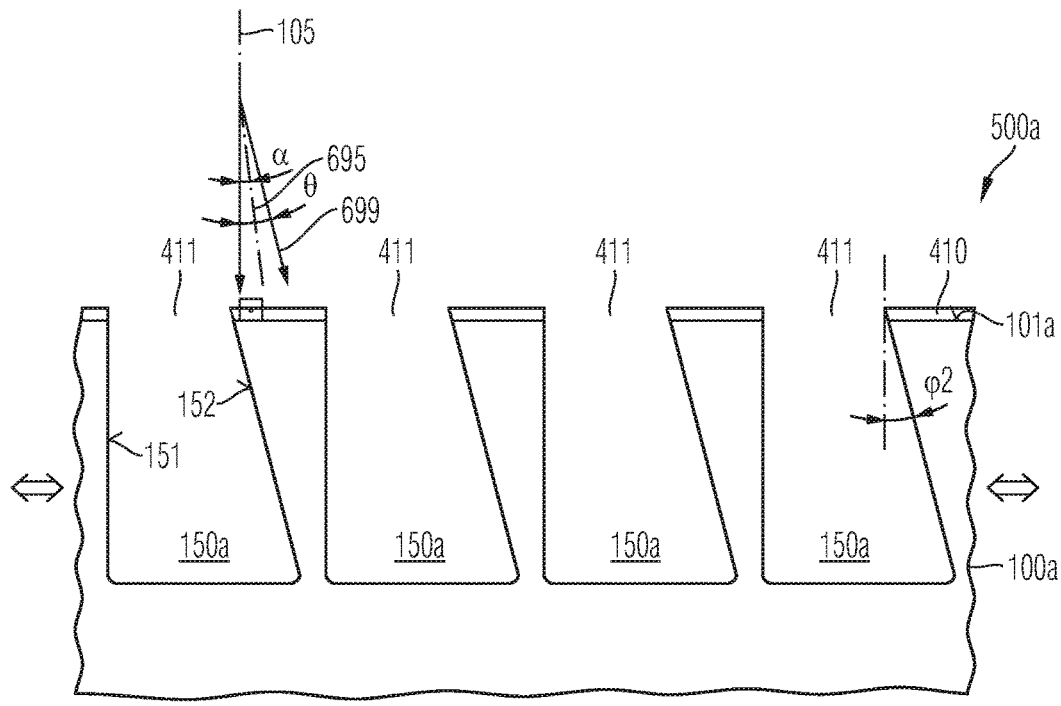
FIG. 5A is a schematic vertical cross-sectional view of a portion of a semiconductor substrate for illustrating a method of manufacturing a semiconductor device according to an embodiment using a divergent directed ion beam for forming electrode trenches, during application of the divergent directed ion beam.
Figure 5B:
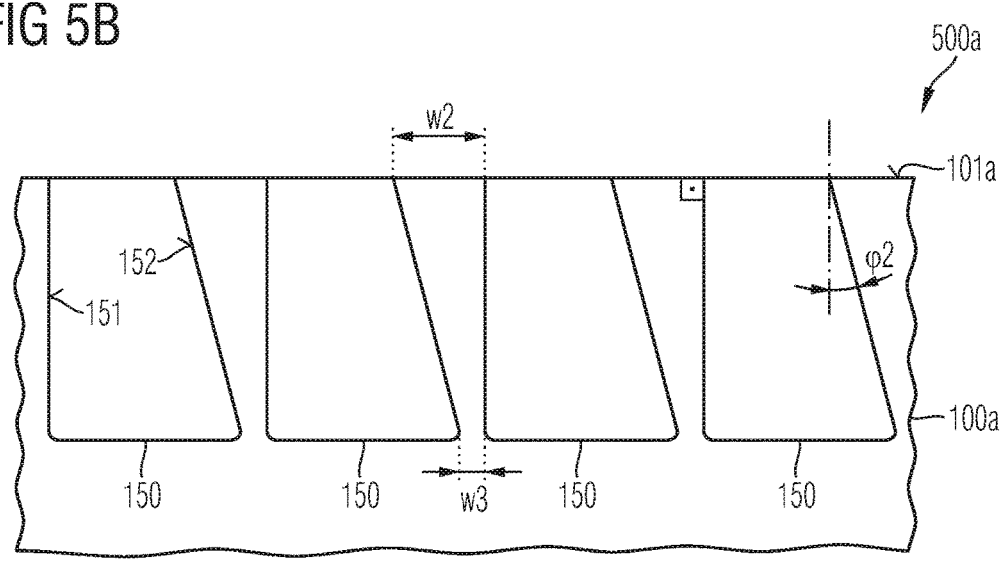
FIG. 5B is a schematic vertical cross-sectional view of the semiconductor substrate portion of FIG. 5A, after forming electrode structures in the electrode trenches.

FIGS. 5A and 5B concern a method using a divergent directed ion beam 699 to form narrowed mesa sections 170 between bulgy electrode structures 150.

A semiconductor substrate 500a illustrated in FIG. 5A includes an etch mask 410 formed on a process surface 101a of a semiconductor base 100a. A divergent directed ion beam 699 is directed to the front side. A beam divergence θ of the divergent directed ion beam may be greater than 5°, e.g. greater 10°. A beam axis 695 may be vertical to the process surface 101a or may be tilted to the normal 105 to the process surface 101a by a tilt angle α. In the illustrated embodiment, the tilt angle α is half the beam divergence θ with α=θ/2. During the implant, for example, during application of the divergent directed ion beam 699 or during idle periods between successive active periods in which the divergent directed ion beam 699 impinges on the semiconductor substrate 500a, the semiconductor substrate 500a is moved along a direction parallel to the process surface 101a.

The divergent directed ion beam 699 forms electrode trenches 150a with vertical first sidewalls 151 and with oblique second sidewalls 152 opposite to the first sidewalls 151, wherein a slope angle φ2 between the second sidewalls 152 and the normal 105 is equal to the beam divergence θ. Neighboring electrode trenches 150a narrow intermediate mesa sections 170 in a distance to the process surface 101a. The bottom of the electrode trenches 150a may be parallel to the process surface 101a, orthogonal to the beam axis 695 or may have a shape bounded by a horizontal plane and a plane orthogonal to the beam axis 695.

The etch mask 410 may be removed. Before or after removal of the etch mask 410 electrode structures 150 as illustrated in FIG. 5B are formed in the electrode trenches 150a of FIG. 5A. The electrode structures 150 may include a conductive electrode 155 that directly adjoins at least portions of the mesa sections 170 or that is separated from the mesa sections 170 by an electrode dielectric 159.

Narrowing the mesa sections 170 in a distance to the process surface 101a decouples to some degree requirements concerning the top mesa width w2 of the top surfaces of the mesa sections 170, e.g., lithography requirements from physical characteristics determined by a dopant concentration and a constriction width w3 of a constricted section of the mesa section 170, i.e., the narrowest section of the mesa sections 170. A ratio w2:w3 may be at least 3:2, 2:1, or at least 5:1.

Figure 6A:
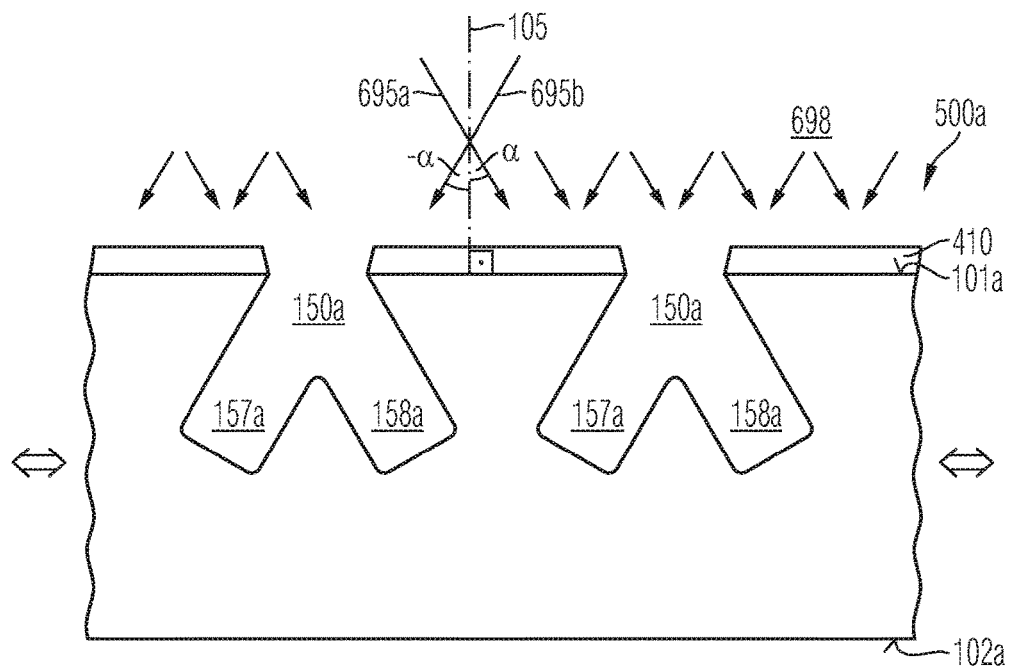
FIG. 6A is a schematic vertical cross-sectional view of a portion of a semiconductor substrate for illustrating a method of manufacturing a semiconductor device according to an embodiment using a bi-directional ion beam to form electrode trenches, during application of the bi-directional ion beam.

FIG. 6A uses a bi-directional ion beam 698 that includes two components with symmetric tilt angles α, −α with respect to the normal 105. The resulting electrode trenches 150a include two symmetric branches 157a, 158a, respectively.

Figure 6B:
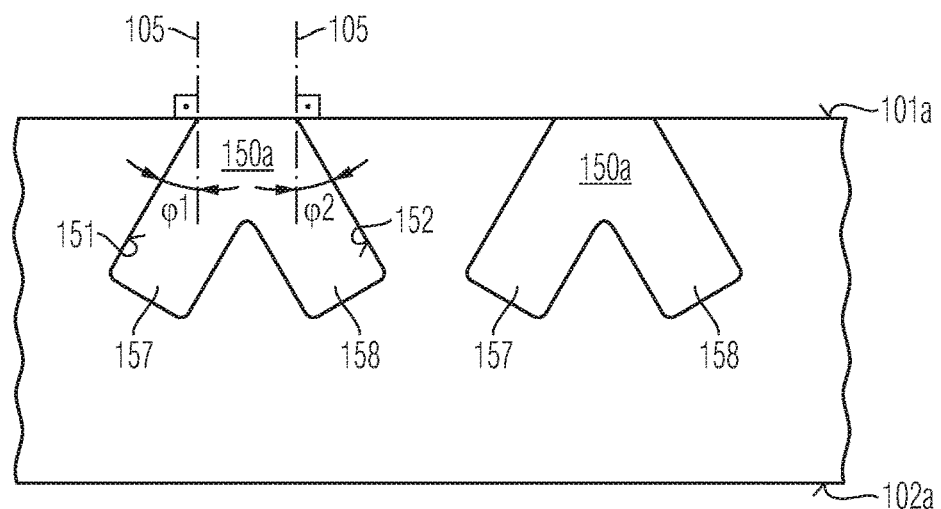
FIG. 6B is a schematic vertical cross-sectional view of the semiconductor substrate portion of FIG. 6A, after forming electrode structures in the electrode trenches.

FIG. 6B shows electrode structures 150 with symmetric electrode branches 157, 158 which first and second sidewalls 151, 152 have symmetric slope angles φ1, φ2 with φ1=α and φ2=−α.

Figure 7:
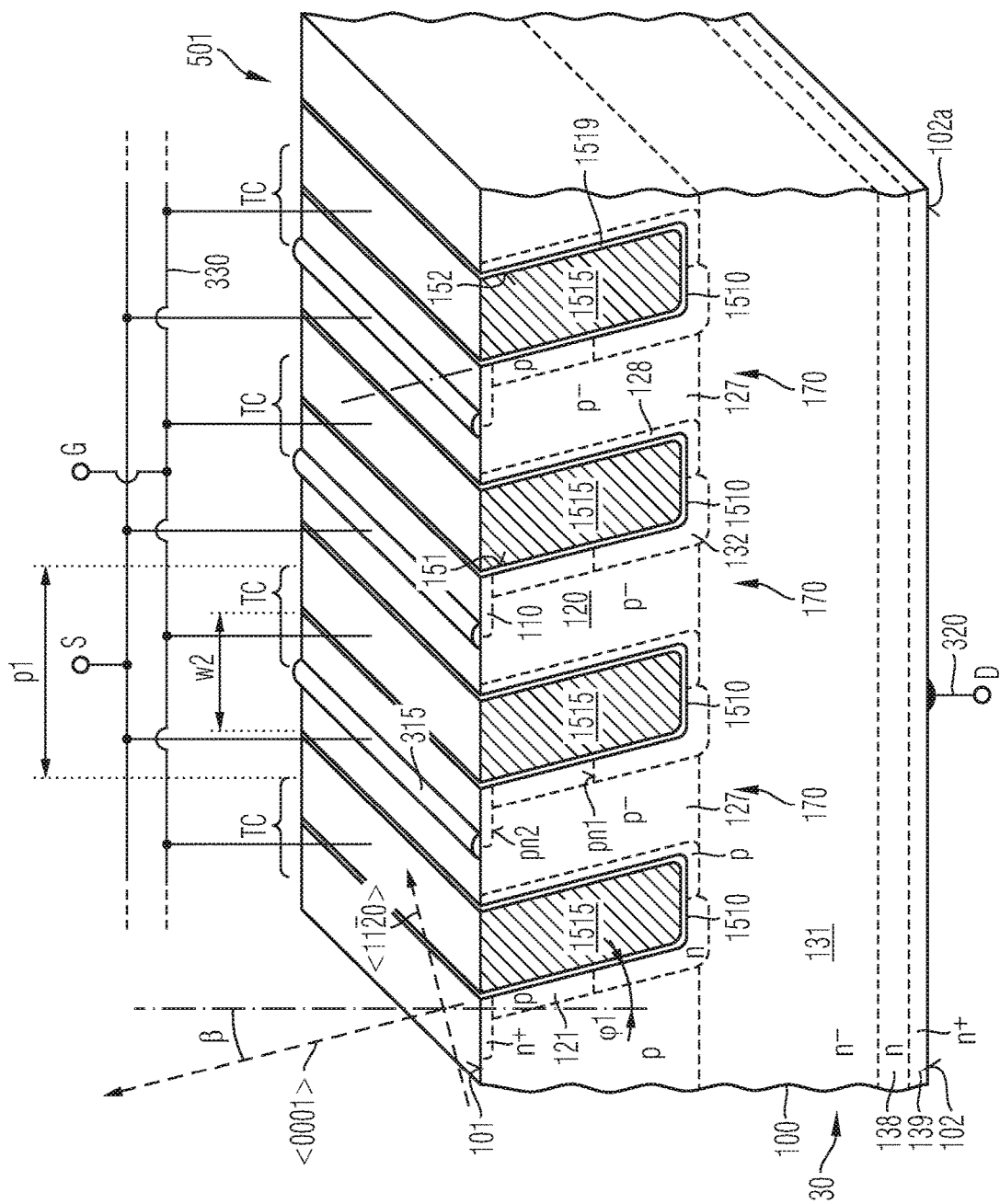
FIG. 7 is a schematic perspective view of a portion of a semiconductor device according to an embodiment related to an SiC TIGFET (trench insulated gate field effect transistor) with asymmetric transistor cells and tilted trench gate structures.

FIG. 7 shows a SiC-TIGFET (silicon carbide trench insulated gate field effect transistor) 501 that may be formed by using angled implants through sidewalls of electrode trenches tilted to the normal of a process surface as discussed with respect to FIGS. 3A to 3C.

The SiC-TIGFET 501 includes a semiconductor portion 100 from silicon carbide. A first surface 101 of the semiconductor portion and a second surface 102 on the back are parallel to each other. A distance between the first surface 101 and the second surface 102 is related to the nominal blocking capability of the SiC-TIGFETs 501 and may in a range of several hundred nm to several hundred μm or in a range from 3 μm to 200 μm.

Asymmetric transistor cells TC are formed at the front side. The transistor cells TC include electrode structures extending from the first surface 101 into the semiconductor portion 100 and forming trench gate structures 1510. The trench gate structures 1510 include a conductive gate electrode 1515 and a gate dielectric 1519 separating the gate electrode 1515 from the semiconductor portion 100. The trench gate structures 1510 are tilted to a normal 105 to the first surface 101 by a slope angle φ1 and first and second sidewalls 151, 152 of the mesa sections 170 are parallel to each other.

A drain structure 130 between the transistor cells TC and the second surface 102 includes a heavily doped contact portion 139 directly adjoining the second surface 102. A lightly doped drift zone 131 of the same conductivity type as the contact portion 139 is formed between the transistor cells TC and the contact portion 139. The drain structure 130 may further include a field stop layer 138 sandwiched between the lightly doped drift zone 131 and the heavily doped contact portion 139, wherein a mean dopant concentration in the field stop layer 138 is at least twice or ten times the mean dopant concentration in the drift zone 131 and is at most a tenth of a maximum dopant concentration in the contact portion 139.

The semiconductor portion 100 includes mesa sections 170 between the trench gate structures 1510. Source regions 110 in the mesa sections 170 may be formed as wells extending from the first surface 101 along first sidewalls 151 of the trench gate structures 1510 into the mesa sections 170. The source regions 110 may be spaced from the second sidewalls 152 of the neighboring trench gate structures 1510. Body regions 120 in the mesa sections 170 separate the source regions 110 from the drain structure 130 and form first pn junctions pn1 with the drain structure 130 and second pn junctions pn2 with the source regions 110.

The mesa sections 170 include at least one sidewall implant zone 121, 128, 132 directly adjoining to the trench gate structure 1510, wherein the sidewall implant zone 121, 128, 132 is selectively formed along at least portions of only one of the first and second sidewalls 151, 152. The respective sidewall implant zone 121, 128, 132 may have uniform width across at least 80% of its extension along the trench gate structure 1510.

For example, the body regions 120 may include channel regions 121 that extend at uniform width along a portion of the first sidewalls 151, wherein a mean dopant concentration in the channel regions 121 is higher than in a main body portion 127 spaced from the first sidewalls 151.

According to another embodiment, junction regions 132 with the conductivity type of the drift zone 131 may directly adjoin to the channel regions 121 and may extend at uniform width along further sections of the first sidewalls 151, wherein the further sections are oriented to the back. The junction regions 132 connect the channel regions 121 with the drift zone 131. Alternatively or in addition, heavily doped shielding regions 128 may extend at uniform width along the second sidewalls 152 and along sections of the bottom portion. The shielding regions 128 may shield sections of the gate dielectric 1519 against the potential applied to the contact portion 139.

An interlayer dielectric on the first surface 101 covers the trench gate structures 1510. A first load electrode 310 may form a metal plate on the interlayer dielectric. Contact structures 315 extending through openings of the interlayer dielectric electrically connect the first load electrode 310 with the source and body regions 110, 120 in the mesa sections 170. The first load electrode 310 may form or may be electrically connected or coupled to a source terminal S of the SiC-TIGFET.

A second load electrode 320 may directly adjoin to the second surface 102 and forms an ohmic contact with the contact portion 139. The second load electrode 320 may form or may be electrically connected or coupled to a drain terminal D. The gate electrodes 1515 may be electrically connected to a gate metallization 330 which may form or which may be electrically connected or coupled to a gate terminal G.

The semiconductor portion 100 may be from a crystalline semiconductor material with a hexagonal crystal lattice, wherein a main crystal axis of the semiconductor portion 100 is tilted to the normal 105 to the first surface 101 at an off-axis angle β in a range from |2°| to |8°|. The off-axis angle β may be equal to the slope angle φ such that the first sidewalls 151 are formed from crystal planes with high carrier mobility.

By forming the second sidewalls 152 parallel to the first sidewalls 151, the top surface of the mesa sections 170 remains comparatively wide such that lithographic requirements for patterning processes concerning the top surfaces of the mesa sections 170 remain relaxed. Alternatively or in addition, the center-to-center distance p1 between neighboring trench gate structures 1510 may be narrowed such that area efficiency is improved.

Figure 8A:
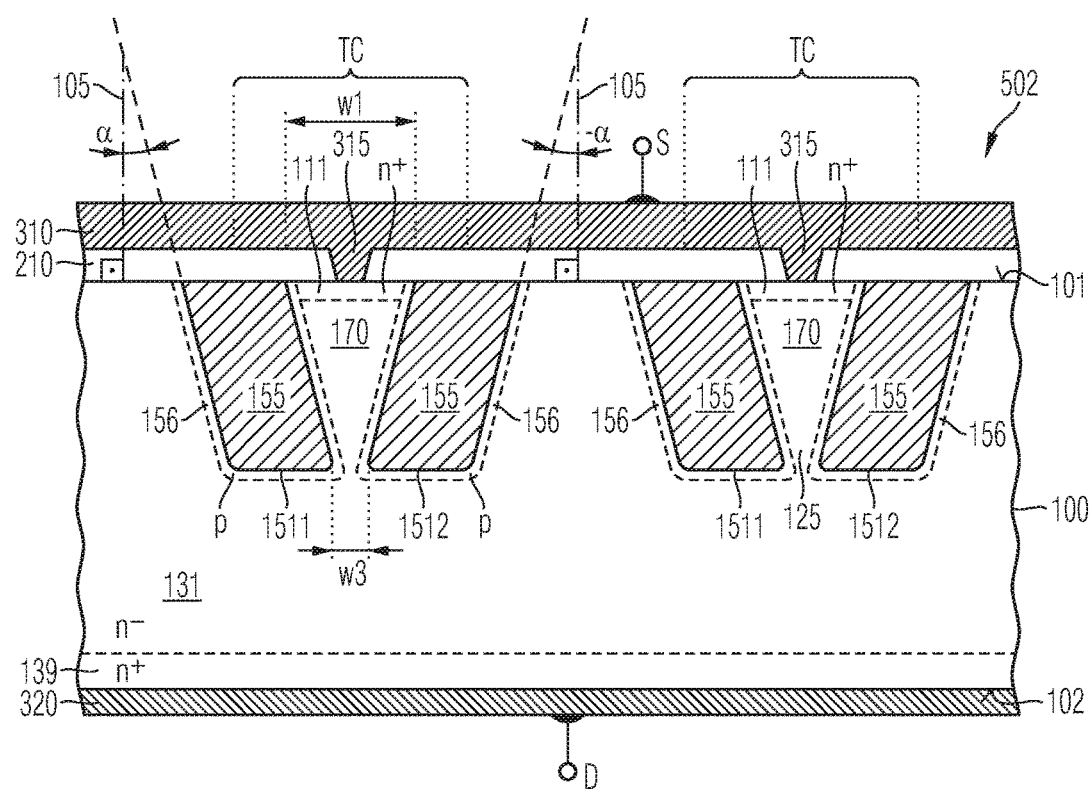
FIG. 8A is a schematic vertical cross-sectional view of a portion of a semiconductor device according to an embodiment related to a JFET (junction field effect transistor) with symmetrically tilted trench gate structures.
Figure 8B:
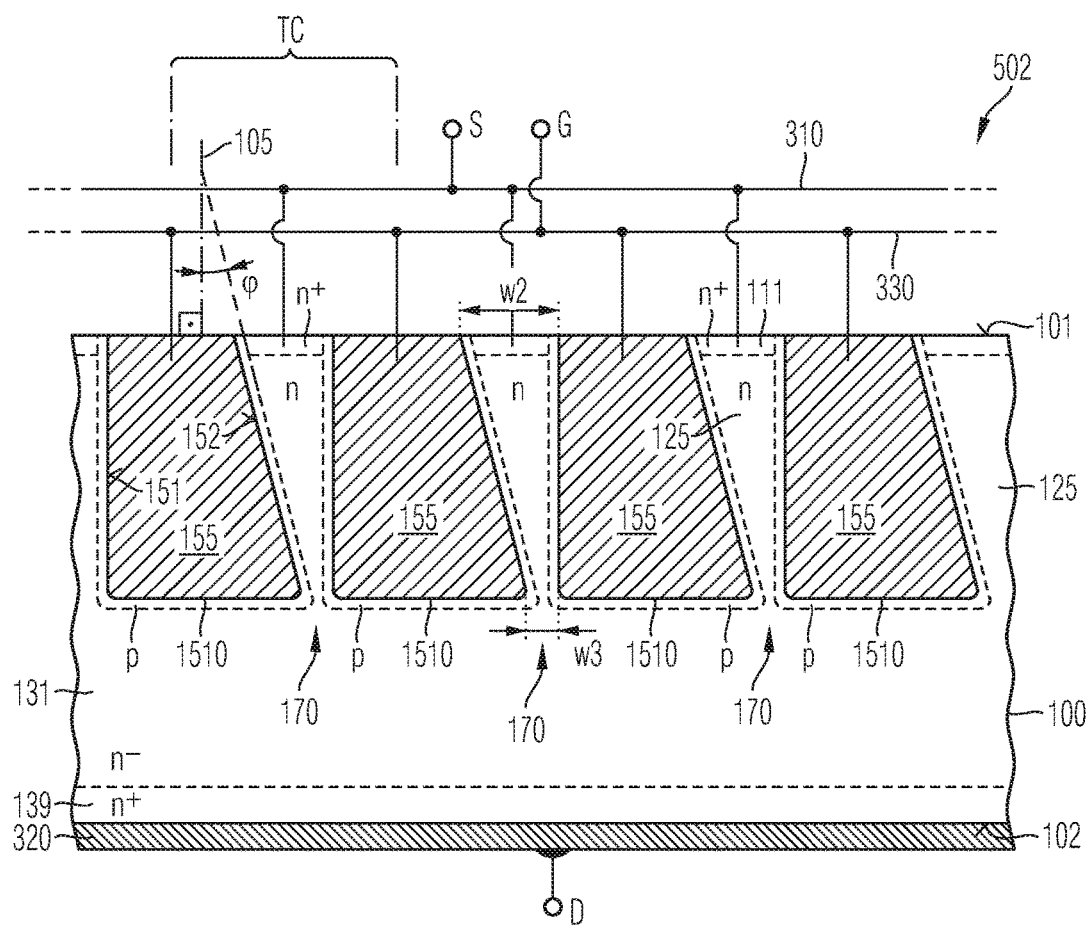
FIG. 8B is a schematic vertical cross-sectional view of a portion of a semiconductor device according to an embodiment related to a JFET with trench gate structures with vertical and non-vertical sidewalls.
Figure 8C:
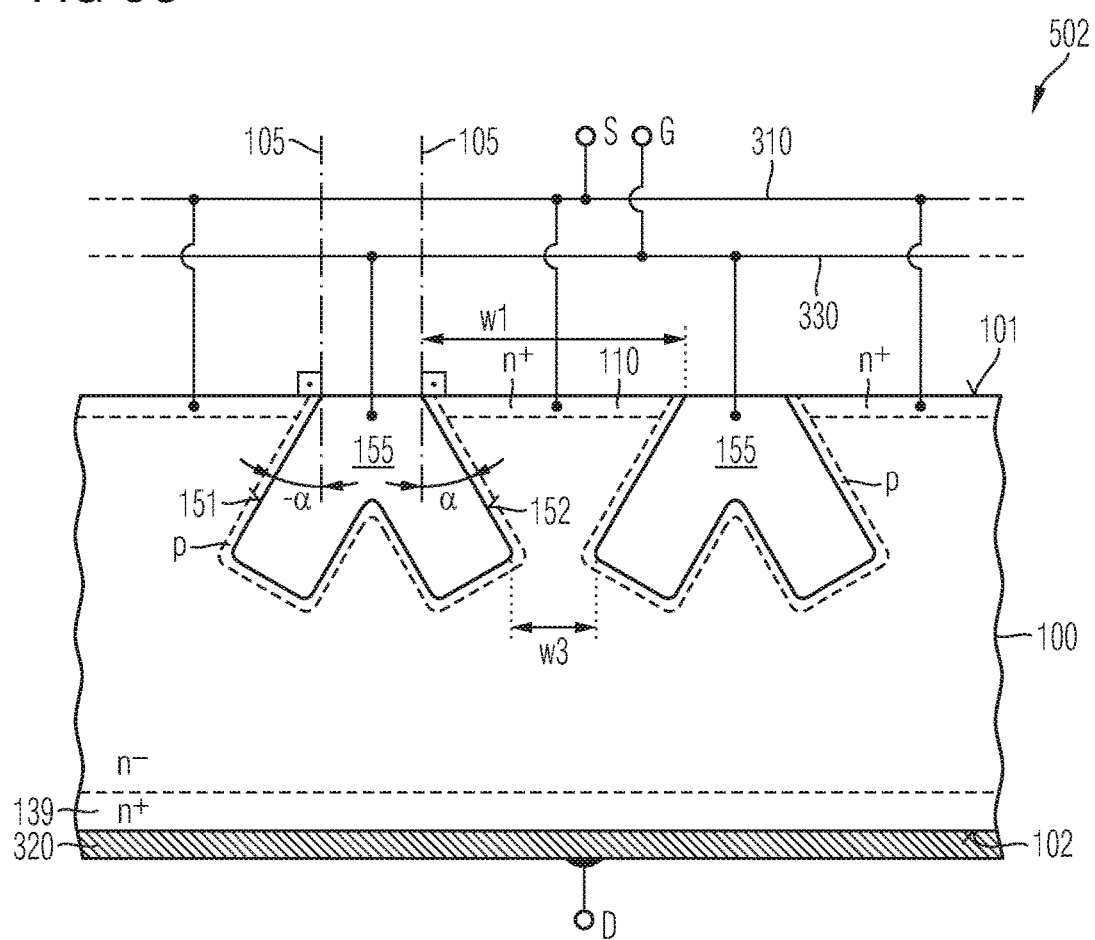
FIG. 8C is a schematic vertical cross-sectional view of a portion of a semiconductor device according to an embodiment related to a JFET with branch-like trench gate structures.

FIGS. 8A to 8C concern JFETs benefiting from locally narrowed mesa sections 170.

In FIG. 8A a JFET 502 includes a plurality of transistor cells TC electrically connected in parallel. A semiconductor portion 100, which may be of Si, Ge, SiGe, SiC, GaN or any other $A_{III}B_V$ semiconductor crystal may include source contact zones 111 formed along the first surface 101 and a contact portion 139 effective as drain contact along a second surface 102. Each transistor cell TC includes a pair of first and second trench gate structures 1511, 1512, wherein vertical axes of the first and second trench gate structures 1511, 1512 of the same pair are tilted to each other and wherein a mesa section 170 between them tapers into the direction of the second surface 102.

The mesa section 170 between a pair of first and second trench gate structures 1511, 1512 of the same transistor cell TC has a constricted portion in a distance to the first surface 101. A constriction width w3 of the narrowest section may be 10%, for example 20%, or 50% of the width w2 of the top surfaces of the mesa sections 170.

The source contact zones 111 are formed in the mesa sections 170 along the top surface. In the mesa sections 170, channel portions 125 of the conductivity type of the contact portion 139 and the source contact zone 111 extend from the source contact zone 111 through the constricted mesa sections to a drift zone 131. Gate regions 156 of uniform width may extend along sidewalls and bottom portions of the first and second trench gate structures 1511, 1512. The gate regions 156 form pn junctions pn0 with the channel portions 125. A dopant concentration in the channel portions 125, a width of the gate regions 156 and the constriction width w3 of the constricted sections determine a threshold voltage at which a depletion layer extending along the pn junctions pn0 pinches off a current flow through the channel portions 125. According to an embodiment, the constriction width w3 is selected such that the JFET 502 is normally off.

In FIG. 8B a JFET 502 includes transistor cells TC on the basis of trench gate structures 1510 resulting from the method as discussed with reference to FIGS. 5A to 5B. First sidewalls 151 may be vertical and the gate regions 156 may be formed at least on one side, for example at least along the first sidewalls 151 to define the pinch-off voltage of the transistor cells TC.

FIG. 8C refers to a JFET 502 obtained from the method as illustrated in FIGS. 6A to 6B. For further details of FIGS. 8B and 8C reference is made to the description of FIG. 8A.

FIG. 9 refers to an IGBT 503, which may be a PT-IGBT (punch-through IGBT) an NPT-IGBT (non-punch-through IGBT), an RB-IGBT (reverse blocking IGBT), or an RC-IGBT (reverse conducting IGBT), by way of example. The IGBT 503 is based on a semiconductor portion 100 from a crystalline semiconductor material such as Si, SiC, Ge, SiGe, GaN or another $A_{III}B_V$ semiconductor.

A first surface 101 and a second surface 102 of the semiconductor portion 100 are parallel to each other. A minimum distance between the first and second surfaces 101, 102 is related to the voltage blocking capability of the IGBT 503. For example, the distance between the first and second surfaces 101, 102 may be 90 µm to 110 µm for blocking voltages of about 1200 V. Other embodiments related to PT-IGBTs or other IGBTs with high blocking capabilities may be based on semiconductor portions 100 with a thickness of several 100 µm, e.g., in a range from 50 µm to 60 µm for semiconductor devices with a blocking capability of about 600V.

The semiconductor portion 100 may have a rectangular shape with an edge length in the range of several millimeters. The normal 105 to the first and second surfaces 101, 102 defines a vertical direction and directions orthogonal to the normal 105 are horizontal directions.

Trench gate structures 1510 and field electrode structures 1520 extend from the first surface 101 into the semiconductor portion 100. Mesa sections 170 of the semiconductor portion 100 separate neighboring trench gate structures 1510 and field electrode structures 1520. A vertical extension v1 of the trench gate structures 1510 and the field electrode structures 1520 may be in the range from 1 µm to 20 µm, for example in a range from 2 µm to 7 µm. The trench gate structures 1510 and the field electrode structures 1520 may have the same vertical extension or may have different vertical extensions. A center-to-center distance p1 between neighboring trench gate structures 1510 and field electrode structures 1520 may be in a range from 500 nm to 5 µm, for example, from 1.0 µm to 4 µm. The trench gate structures 1510 and the field electrode structures 1520 may form a regular pattern of equidistant, parallel stripes with longitudinal axes orthogonal to the cross-sectional plane.

The trench gate structures 1510 include a conductive gate electrode 1515 and a gate dielectric 1519 separating the conductive gate electrode 1515 from the semiconductor portion 100. The field electrode structures 1520 include a conductive field electrode 1525 and a field dielectric 1529 separating the field electrode 1525 from the semiconductor portion 100. The field dielectric 1529 and the gate dielectric 1519 may differ in thickness and composition or may be from the same material(s) and may have the same material configuration as well as the same layer thickness.

The gate electrode 1515 and the field electrode 1525 may be formed from different materials or may be formed from the same materials in the same configuration. The cross-sectional shape as well as the spatial dimensions of the field electrode structures 1520 may differ from those of the trench gate structures 1510 or may be the same.

The trench gate structures 1510 and the field electrode structures 1520 may result from application of a divergent directed ion beam described with reference to FIGS. 5A and 5B. The first sidewalls 151 may be formed symmetrically to second sidewalls 152 with respect to the vertical direction. According to the illustrated embodiment the first sidewalls 151 are vertical to the first surface 101 and the second sidewalls 152 are tilted to the first surface 101 by a slope angle φ of at least 1.5°, at least 3°, or at least 5°. The mesa sections 170 include active mesas 171 and non-active mesas 172. Active mesas 171 include source regions 110, which are electrically connected to a first load electrode 310 and which directly adjoin first sidewalls 151 of the trench gate structures 1510. Non-active mesas 172 do not include source regions 110 that are electrically connected to the first load electrode 310 and do not directly adjoin to first sidewalls 151 of trench gate structures 1510, but, e.g., to field electrode structures 1520 and/or to second sidewalls 152 of the trench gate structures 1510.

In the active mesas 171 body regions 120 separate the source regions 110 from a drain structure 130.

The drain structure 130 includes a heavily doped contact portion 139 directly adjoining to the second surface 102. The heavily doped contact portion 139 may be a uniformly doped structure with a conductivity type of the body regions 120 for reverse blocking IGBTs or may include oppositely doped regions of both conductivity types alternatingly arranged along the lateral direction in case the IGBT 503 is a RC-IGBT.

A mean net impurity concentration in the contact portion 139 forming a collector layer may be at least $1E16\ cm^{-3}$, for example at least $5E17\ cm^{-3}$. The drain structure 130 further includes a lightly doped drift zone 131 with first sections 131a formed in the mesa sections 170 and with a continuous second section 131b formed between the trench gate structures 1510/field electrode structures 1520 and the contact portion 139. A mean net impurity concentration in the drift zone 131 may be between $1E12\ cm^{-3}$ and $5E14\ cm^{-3}$, for example between $5E12\ cm^{-3}$ and $1E14\ cm^{-3}$. In each of the first and second sections 131a, 131b the net impurity concentration may be constant, strictly decreasing or strictly increasing. A field stop layer 138 may separate the drift zone 131 from the contact portion 139, wherein a mean net dopant concentration in the field stop layer 138 may be at least twice or at least ten times as high as in an adjoining section of the second section 131b of the drift zone 131 and at most half, e.g. at most 10% of the maximum dopant concentration in the contact portion 139. The drain structure 130 may include further doped regions, e.g., barrier regions of the conductivity type of the drift zone 131, wherein a mean net impurity concentration in the barrier regions is at least five or ten times as high as in the first sections 131a of the drift zone.

The body regions 120 form first pn junctions pn1 with the drain structure 130 and second pn junctions pn2 with the source regions 110.

An interlayer dielectric 210 covers the trench gate structures 1510 and the non-active mesas 172. First contact structures 315 extending from the first load electrode 310 through openings in the interlayer dielectric 210 electrically connect the first load electrode 310 with the source and body regions 110, 120 in the active mesas 171. Second contact structures 316 extending through further openings in the interlayer dielectric 210 electrically connect the first load electrode 310 with the field electrode 1525.

The first load electrode 310 forming an emitter electrode is electrically connected to the emitter terminal E and may include at least one barrier layer having a uniform thickness in the range of 5 nm to 300 nm or from 50 nm to 200 nm and consisting of or containing a layer of titanium nitride TiN, tantalum nitride TaN, titanium Ti or tantalum Ta, by way of example. A main layer of the first load electrode 310 may consist of or contain tungsten W or tungsten-based metals, heavily doped polysilicon, carbon C, aluminum Al, copper Cu, or alloys of aluminum and copper, for example AlCu or AlSiCu.

A second load electrode 320 forming a collector electrode directly adjoins the second surface 102, forms an ohmic contact with the contact portion 139 and may consist of or may contain, as main constituent(s) aluminum Al, copper Cu, or alloys of aluminum or copper, for example AlSi, AlCu or AlSiCu. According to other embodiments, the second load electrode 320 may contain one, two, three or more sub-layers, wherein each sub-layer contains, as main constituent(s), at least one of nickel Ni, titanium Ti, silver Ag, gold Au, tungsten W, platinum Pt and/or palladium Pd. For example, a sub-layer may contain a metal silicide, a metal nitride, or a metal alloy containing Ni, Ti, Ag, Au, W, Pt, and/or Pd. The second load electrode 320 is electrically connected or coupled to a collector terminal C of the IGBT 503.

The following description refers to an n-channel IGBT with p-type body zone, p-type contact portion 139, n-type source region and n-type drift zone 131. Similar considerations apply to p-channel IGBTs with n-type body regions 120, n-type contact portion 139, p-type source regions and p-type drift zone 131.

The electrode structures 150, 160 widen up with increasing distance to the first surface 101 and narrow the mesa sections 170 from a top mesa width w2 to a constriction width w3, wherein w3 is at most 80%, for example at most 50% or at most 20% of the mesa surface width w2. During on-state operation of the IGBT 503 a potential applied to the gate electrode 1515 forms inversion channels of minority charge carriers in the body regions 120 along the gate dielectric 1519. The resulting electron flow turns on a bipolar transistor formed by the p-type body regions 120, the n-type drift zone 131 and the p-type contact portion 139 such that the layered second section 131b of the drift zone 131 is flooded with both holes and electrons. The denser the resulting charge carrier plasma of holes and electrons is, the more conductive is the layered second section 131b and the lower are static losses in the on-state. The holes in the layer second section 131b tend to be drained off through the body regions 120 of the active mesas 171 to the contact structures 315. Narrowing the mesa sections 170 reduces the hole flow through the active mesas 171. The charge carrier plasma in the layer second section 131b remains denser than without the constrictions. As a consequence, the layered second section 131b of the drift zone 131 is more conductive in the on-state.

According to a further embodiment a semiconductor device includes electrode structures that extend from a first surface into a semiconductor portion. Parallel first sidewalls of the electrode structures are vertical or tilted to a normal to the first surface by a first slope angle φ1 greater than 0°. Parallel second sidewalls opposite to the first sidewalls are tilted to the normal to the first surface by a second slope angle φ2 greater than 0°. Gate regions extend along at least portions of at least one of the first and second sidewalls and form pn junctions with channel regions in mesa sections of the semiconductor portion between neighboring electrode structures. The channel regions connect source contact zones and a drain structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor devices, the method comprising:
forming, by directing an ion beam with a beam divergence θ on a process surface of a semiconductor substrate, parallel electrode trenches in the semiconductor substrate, wherein a center axis of the directed ion beam is tilted to a normal to the process surface at a tilt angle α and at least one of the tilt angle α and the beam divergence θ is not equal to zero;
moving the semiconductor substrate along a direction parallel to the process surface during formation of the electrode trenches; and
forming a conductive electrode in the electrode trenches, wherein first sidewalls of the electrode trenches are tilted to the normal by a first slope angle φ1 with φ1=α+θ/2 and second sidewalls are tilted to the normal by a second slope angle φ2 with φ2=α−θ/2.

2. The method of claim 1, wherein
at least one of the tilt angle α and the beam divergence θ is greater than 1°.

3. The method of claim 2, wherein
the beam divergence θ is greater than 1°.

4. The method of claim 2, wherein
the tilt angle α is greater than 1°.

5. The method of claim 1, wherein
the tilt angle α deviates from a half of the beam divergence θ by not more than 1°.

6. The method of claim 1, wherein
the semiconductor substrate is moved while the directed ion beam impinges on the process surface.

7. The method of claim 1, wherein
the semiconductor substrate is moved between two successive periods, in which the directed ion beam impinges on the process surface.

8. The method of claim 1, wherein
forming the conductive electrode comprises lining the electrode trenches with an electrode dielectric and filling the lined electrode trenches with conductive material.

9. The method of claim 1, wherein
the semiconductor substrate is from a crystalline semiconductor material with a hexagonal crystal lattice, an main crystal axis of the crystalline semiconductor material is tilted to the normal on the first surface at an off-axis angle β in a range from |2°| to |8°|, and the directed ion beam is parallel to the main crystal axis.

10. The method of claim 9, wherein the first sidewalls of the electrode trenches are (11-20) or (1-100) crystal planes.

11. The method of claim 1, further comprising:
forming, by directing a supplementary ion beam to the process surface of the semiconductor substrate, second electrode trenches in the semiconductor substrate, wherein longitudinal axes of the second electrode trenches are parallel to longitudinal axes of the electrode trenches forming first electrode trenches and first sidewalls of the second electrode trenches are tilted to the first sidewalls of the first electrode trenches.

12. The method of claim 11, wherein
the supplementary ion beam is tilted to the normal to the process surface at a tilt angle −α and the first sidewalls of the second electrode trenches are tilted to the first sidewalls of the first electrode trenches by twice the tilt angle α.

13. A semiconductor device comprising:
a trench gate structure extending from a first surface into a semiconductor portion, wherein a first sidewall and an opposite second sidewall of the trench gate structure are parallel to each other and the trench gate structure is tilted to a normal to the first surface by a slope angle φ; and
at least one sidewall implant zone directly adjoining to the trench gate structure in a mesa section of the semiconductor portion, wherein the sidewall implant zone is selectively formed along one of the first and second sidewalls.

14. The semiconductor device of claim 13, wherein
a width of the sidewall implant zone orthogonal to the first or second sidewall is uniform across at least 80% of an extension of the sidewall implant zone along the trench gate structure.

15. The semiconductor device of claim 13, wherein
the at least one sidewall implant zone includes a channel region of a body region forming a first pn junction with a drain structure.

16. The semiconductor device of claim 13, wherein
the at least one sidewall implant zone includes a junction region of a drain structure forming a first pn junction with a body region.

17. The semiconductor device of claim 13, wherein
the at least one sidewall implant zone includes a channel region and a junction region forming a first pn junction with the channel region.

18. The semiconductor device of claim 13, wherein
the at least one sidewall implant zone includes a shielding region at a side of the trench gate structure opposite to a channel region.

19. The semiconductor device of claim 13, wherein
the semiconductor portion is from a crystalline semiconductor material with a hexagonal crystal lattice, a main crystal axis of the semiconductor portion is tilted to the normal to the first surface at an off-axis angle β in a range from |2°| to |8°|, wherein the off-axis angle β is equal to the slope angle φ.

20. A semiconductor device comprising:
electrode structures extending from a first surface into a semiconductor portion, wherein first sidewalls of the electrode structures are vertical to the first surface and second sidewalls opposite to the first sidewalls are tilted to a normal to the first surface by a slope angle φ greater than 1°; and
body regions formed in mesa sections of the semiconductor portion between the electrode structures, wherein the body regions form, in the mesa sections, first pn junctions with a drain structure and second pn junctions with source regions.

21. The semiconductor device of claim 20, wherein
the electrode structures comprise trench gate structures and the body regions directly adjoined to the first sidewalls of the trench gate structures.

22. The semiconductor device of claim 20, wherein
the slope angle φ is greater than 4°.

23. The semiconductor device of claim 20, wherein
the electrode structures comprise field electrode structures comprising a field electrode electrically connected to a first load electrode.

* * * * *